(12) United States Patent
Kato

(10) Patent No.: US 12,543,476 B2
(45) Date of Patent: Feb. 3, 2026

(54) DISPLAY DEVICE AND ELECTRONIC DEVICE WITH MULTILAYER CATHODE ELECTRODE

(71) Applicant: Sony Group Corporation, Tokyo (JP)

(72) Inventor: Takayoshi Kato, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 672 days.

(21) Appl. No.: 17/802,440

(22) PCT Filed: Jan. 27, 2021

(86) PCT No.: PCT/JP2021/002763
§ 371 (c)(1),
(2) Date: Aug. 25, 2022

(87) PCT Pub. No.: WO2021/176894
PCT Pub. Date: Sep. 10, 2021

(65) Prior Publication Data
US 2023/0110063 A1 Apr. 13, 2023

(30) Foreign Application Priority Data

Mar. 3, 2020 (JP) .................................. 2020-035663

(51) Int. Cl.
*H10K 59/80* (2023.01)
*H10K 59/12* (2023.01)
*H10K 59/131* (2023.01)

(52) U.S. Cl.
CPC ..... *H10K 59/80523* (2023.02); *H10K 59/131* (2023.02); *H10K 59/1315* (2023.02); *H10K 59/1201* (2023.02)

(58) Field of Classification Search
CPC ........... H10K 59/80523; H10K 59/131; H10K 59/1315; H10K 59/1201; H10K 71/00; H10K 50/822
(Continued)

(56) References Cited

U.S. PATENT DOCUMENTS 7,919,352 B2 * 4/2011 Pearce ................. H10K 71/231
438/99
8,609,181 B2 * 12/2013 Yamazaki ............ H10K 50/828
427/69
(Continued)

FOREIGN PATENT DOCUMENTS

CN 108321305 A 7/2018
JP 2009016298 A 1/2009
(Continued)

OTHER PUBLICATIONS

International Search Report (PCT/ISA/210), International Application No. PCT/JP2021/002763, dated Mar. 16, 2021.

*Primary Examiner* — Eric W Jones
(74) *Attorney, Agent, or Firm* — Michael Best & Friedrich LLP

(57) ABSTRACT

A display device of the present disclosure includes a light emitting unit, multilayer cathode electrodes stacked on the light emitting unit in two or more layers with a protective film interposed between the cathode electrodes and electrically connected to each other, and a potential supply wire that applies predetermined potential to the multilayer cathode electrodes. Then, the cathode electrodes of second and subsequent layers out of the multilayer cathode electrodes are electrically connected to the potential supply wire via a first contact hole.

18 Claims, 17 Drawing Sheets

(58) Field of Classification Search
USPC .............................................. 257/40, 59, 99
See application file for complete search history.

(56) References Cited

U.S. PATENT DOCUMENTS

| | | | | |
|---|---|---|---|---|
| 8,917,015 B2* | 12/2014 | Iwata | .................... | H10K 59/876 |
| | | | | 313/506 |
| 9,362,345 B2* | 6/2016 | Jeong | .................... | H10K 59/122 |
| 10,388,703 B2* | 8/2019 | Park | ....................... | H10K 71/00 |
| 2007/0048886 A1* | 3/2007 | Winters | ........... | H10K 59/80522 |
| | | | | 438/795 |
| 2009/0109208 A1* | 4/2009 | Yamashita | ........... | G09G 3/3233 |
| | | | | 345/214 |
| 2013/0341607 A1* | 12/2013 | Heo | ................... | H10K 59/1315 |
| | | | | 438/23 |
| 2014/0167604 A1* | 6/2014 | Iwata | .................... | H05B 33/22 |
| | | | | 313/504 |
| 2014/0239262 A1* | 8/2014 | Kim | ..................... | H10K 59/123 |
| | | | | 257/40 |
| 2014/0354142 A1* | 12/2014 | Jeong | ................... | H10K 59/122 |
| | | | | 313/506 |
| 2015/0014658 A1* | 1/2015 | Choung | ............... | H10K 50/824 |
| | | | | 257/40 |
| 2015/0349291 A1* | 12/2015 | Song | ...................... | H10K 59/35 |
| | | | | 257/40 |
| 2016/0126304 A1* | 5/2016 | Cho | ...................... | H10K 59/131 |
| | | | | 438/23 |
| 2016/0284785 A1* | 9/2016 | Matsuura | ............... | H10K 59/131 |
| 2018/0102499 A1* | 4/2018 | Pyo | .................. | H10K 59/80516 |
| 2018/0130950 A1* | 5/2018 | Kim | ................... | H10K 50/822 |
| 2018/0261797 A1* | 9/2018 | Lee | ..................... | H10K 50/814 |
| 2019/0096971 A1* | 3/2019 | Ukigaya | ............... | H10K 59/122 |
| 2019/0165064 A1* | 5/2019 | Lee | ..................... | H10K 59/122 |
| 2019/0237703 A1* | 8/2019 | Kim | ..................... | H10K 59/122 |
| 2019/0305051 A1* | 10/2019 | Takahashi | ............. | H10K 50/11 |
| 2021/0111235 A1* | 4/2021 | Ichikawa | ......... | H10K 59/80518 |

FOREIGN PATENT DOCUMENTS

| | | |
|---|---|---|
| JP | 2009105068 A | 5/2009 |
| JP | 2014199739 A | 10/2014 |
| JP | 2016054046 A | 4/2016 |
| JP | 2016181332 A | 10/2016 |
| TW | 201023679 A | 6/2010 |

\* cited by examiner

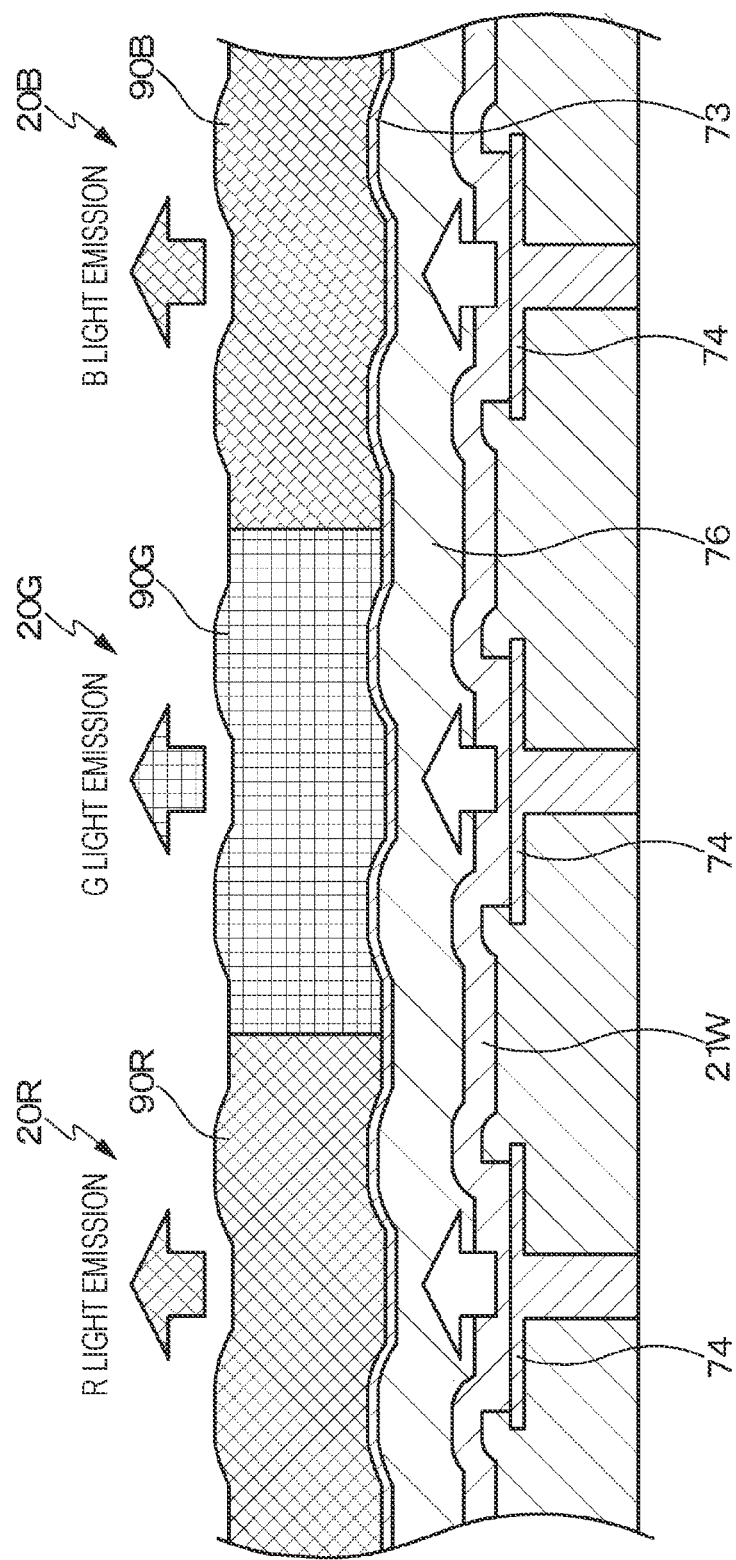

(STEP 1)

(STEP 2)

(STEP 3)

(STEP 4)

(STEP 5)

(STEP 6)

(STEP 1)

(STEP 2)

(STEP 3)

(STEP 4)

(STEP 5)

(STEP 6)

(STEP 1)

(STEP 2)

(STEP 3)

(STEP 4)

DISPLAY DEVICE AND ELECTRONIC DEVICE WITH MULTILAYER CATHODE ELECTRODE

TECHNICAL FIELD

The present disclosure relates to a display device, a method of manufacturing the display device, and an electronic device.

BACKGROUND ART

Flat panel (planar) display devices are mainstream of recent display devices. As one of flat panel display devices, there is a display device using a so-called current-driven electro-optical element in which light emission luminance changes according to a value of current flowing in a device as a light emitting unit (light emitting element) of a pixel. As one of current-driven electro-optical elements, an organic electroluminescence element (hereinafter, sometimes simply abbreviated as an "organic EL element") using a phenomenon of emitting light when an electric field is applied to an organic thin film using electroluminescence (EL) of an organic material is known.

An organic electroluminescence display device (hereinafter, sometimes simply abbreviated as an "organic EL display device") using the organic EL element as the light emitting unit of the pixel generally has a configuration in which a circuit unit that drives the organic EL element is formed on a substrate, an insulating film (interlayer film) is provided in a state of covering the circuit unit, and the organic EL element is arrayed on the insulating film. Then, on the organic EL elements, a cathode electrode is formed as an upper electrode as an electrode common for all the pixels. Predetermined potential is applied to the cathode electrode.

In order to apply predetermined potential to the cathode electrode, conventionally, a contact electrode to which predetermined potential is applied is provided on an outer peripheral portion of an effective pixel area, and the cathode electrode is electrically connected to the contact electrode (refer to, for example, Patent Document 1).

CITATION LIST

Patent Document

Patent Document 1: Japanese Patent Application Laid-Open No. 2014-199739

SUMMARY OF THE INVENTION

Problems to be Solved by the Invention

When the contact electrode is provided on the outer peripheral portion of the effective pixel area and the contact electrode is electrically connected to the cathode electrode as in the conventional technology disclosed in Patent Document 1 described above, there is a case where a sheet resistance of the cathode electrode provided in common for all pixels increases due to various factors. When the sheet resistance of the cathode electrode increases, luminance problematically decreases in the central portion of the effective pixel area as an angle of view is larger and as a current to be applied is larger.

An object of the present disclosure is to provide a display device capable of reducing a sheet resistance of a cathode electrode, a method of manufacturing the display device, and an electronic device including the display device.

Solutions to Problems

A display device of the present disclosure for achieving the above-described object includes:
a light emitting unit;
multilayer cathode electrodes stacked on the light emitting unit in two or more layers with a protective film interposed between the cathode electrodes and electrically connected to each other; and
a potential supply wire that applies predetermined potential to the multilayer cathode electrodes, in which
the cathode electrodes of second and subsequent layers out of the multilayer cathode electrodes are electrically connected to the potential supply wire at a bottom of a first contact hole.

Furthermore, a method of manufacturing a display device of the present disclosure for achieving the above-described object includes:
forming a protective film on a cathode electrode of a first layer to which predetermined potential is applied;
then forming a first contact hole leading to a contact electrode to which predetermined potential is applied in the protective film; and
then forming cathode electrodes of second and subsequent layers electrically connected to the contact electrode at a bottom of the first contact hole and electrically connected to the cathode electrode of the first layer on a side wall of the first contact hole.

Furthermore, an electronic device of the present disclosure for achieving the above-described object includes:
a display device including:
a light emitting unit;
multilayer cathode electrodes stacked on the light emitting unit in two or more layers with a protective film interposed between the cathode electrodes and electrically connected to each other; and
a potential supply wire that applies predetermined potential to the multilayer cathode electrodes, in which
the cathode electrodes of second and subsequent layers out of the multilayer cathode electrodes are electrically connected to the potential supply wire via a first contact hole.

BRIEF DESCRIPTION OF DRAWINGS

FIG. 6 is a cross-sectional structure illustrating a cross-sectional structure of a main part of a panel structure including a combination of a white organic EL element and a color filter.

MODE FOR CARRYING OUT THE INVENTION

Figure 1:
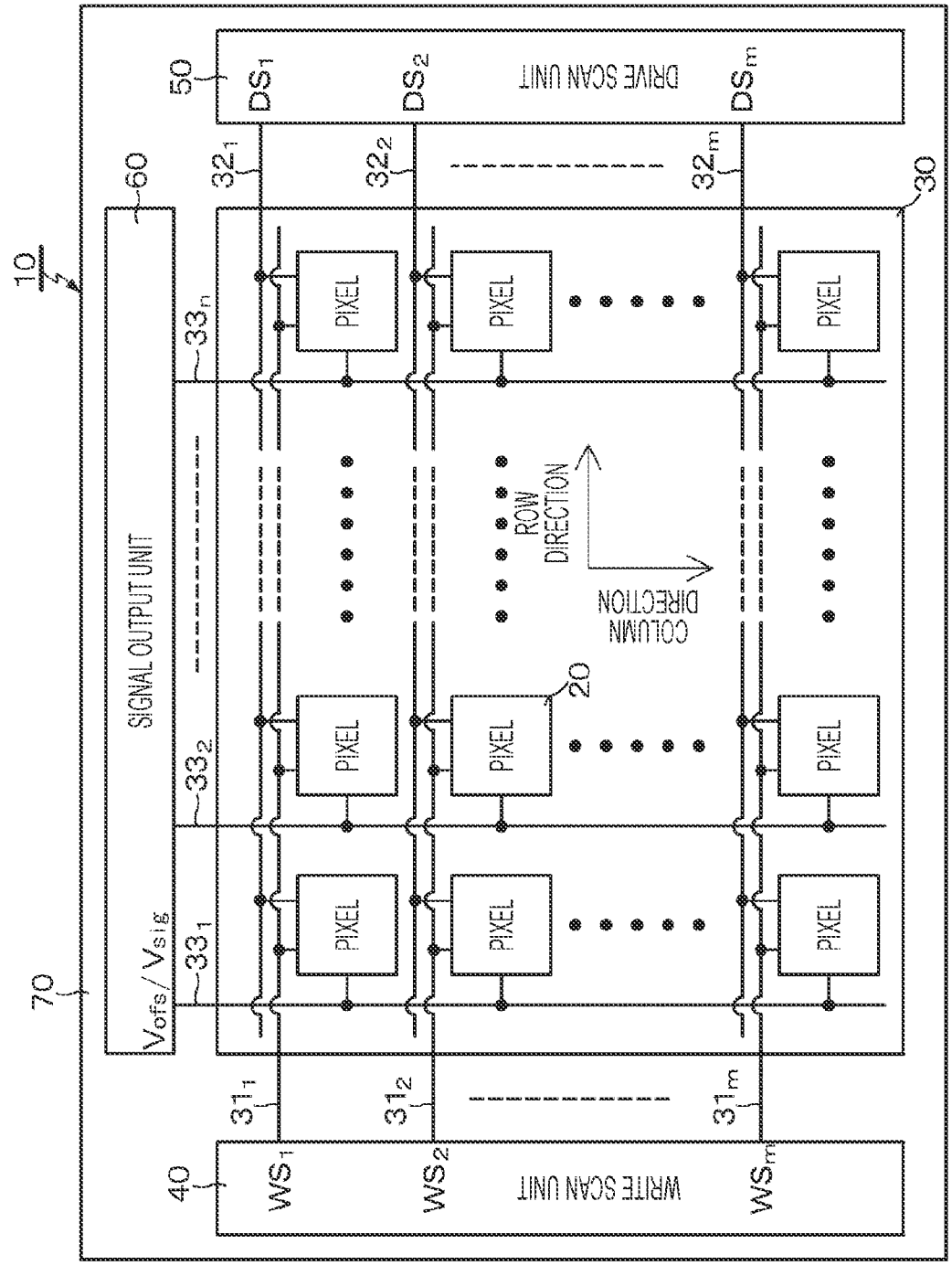
FIG. 1 is a system configuration diagram illustrating an outline of a configuration of an organic EL display device as an example of a display device to which the technology of the present disclosure is applied.

Hereinafter, a mode for carrying out the technology of the present disclosure (hereinafter, referred to as an "embodiment") is described in detail with reference to the drawings. The technology of the present disclosure is not limited to the embodiment, and various numerical values and materials in the embodiment are examples. In the following description, the same reference sign is used for the same elements or elements having the same function, and the description is not repeated. Note that, the description is given in the following order.

1. Description regarding display device, method of manufacturing the same, and electronic device of present disclosure in general
2. Display device to which technology of present disclosure is applied
  2-1. System configuration
  2-2. Pixel circuit
  2-3. Panel structure according to conventional example
3. Display device according to embodiment of present disclosure
  3-1. Example 1 (example of cathode electrodes of two layers: example in which cathode electrode of second layer is electrically connected to potential supply wire at bottom of contact hole, and cathode electrode of first layer is electrically connected to cathode electrode of second layer on side wall of contact hole)
  3-2. Example 2 (example of method of manufacturing display device according to Example 1)
  3-3. Example 3 (variation of Example 1: example in which cathode electrode of first layer is electrically connected to cathode electrode of second layer via dedicated contact hole)
  3-4. Example 4 (example of method of manufacturing display device according to Example 3)
  3-5. Example 5 (example of cathode electrodes of three layers: example in which cathode electrode of third layer is electrically connected to potential supply wire at bottom of contact hole, and cathode electrode of third layer is electrically connected to cathode electrodes of first and second layers on side wall of contact hole)
  3-6. Example 6 (example of method of manufacturing display device according to Example 5
  3-7. Example 7 (arrangement example of electrical connection portions of cathode electrodes of second and subsequent layers to potential supply wire, and electrical connection portions between cathode electrodes of respective layers)
4. Variation
5. Electronic device of present disclosure
  5-1. Specific Example 1 (example of digital still camera)
  5-2. Specific Example 2 (example of head mounted display)
6. Configuration that present disclosure may take <Description Regarding Display Device, Method of Manufacturing the Same, and Electronic Device of Present Disclosure in General>

In a display device, a method of manufacturing the same, and an electronic device of the present disclosure, a cathode electrode of a first layer and cathode electrodes of second and subsequent layers may be electrically connected to each other on a side wall of a first contact hole. Furthermore, the cathode electrode of the first layer and the cathode electrodes of the second and subsequent layers may be electrically connected to each other at a bottom of a second contact hole.

In the display device, the method of manufacturing the same, and the electronic device of the present disclosure including the preferable configuration described above, a cathode contact portion in which the cathode electrodes of the second and subsequent layers are electrically connected to a potential supply wire may be provided in an effective pixel area. At that time, the cathode contact portion may be provided for each pixel in the effective pixel area, provided for each area of a predetermined size in the effective pixel area, or provided in the vicinity of a pixel in the central portion in the effective pixel area.

Furthermore, in the display device, the method of manufacturing the same, and the electronic device of the present disclosure including the preferable configuration described above, a light emitting unit may include an organic electroluminescence element. At that time, an organic layer may be formed in units of pixels using monochromatic light emitting organic materials of a plurality of colors, or may be formed in common for all the pixels using a white light emitting organic material such that one stage is provided or two or more stages are stacked.

Furthermore, in the display device, the method of manufacturing the same, and the electronic device of the present disclosure including the preferable configuration described above, a drive circuit unit of the light emitting unit may be formed on a semiconductor substrate.

<Display Device to which Technology of Present Disclosure is Applied>

The display device to which the technology of the present disclosure is applied is a so-called active matrix display device in which the light emitting unit (light emitting element) is driven to emit light by a thin film transistor (TFT) formed on a transparent insulating substrate or a metal oxide semiconductor (MOS) transistor formed on a silicon semiconductor substrate.

As the light emitting unit, there is a current-driven electro-optical element in which light emission luminance changes according to a current value applied to a device. An organic EL element may be exemplified as the current-driven electro-optical element. Here, as an example, an active matrix organic EL display device using the organic EL element, which is the current-driven electro-optical element, as the light emitting unit of a pixel circuit is described as an example. Hereinafter, the "pixel circuit" is sometimes simply described as a "pixel".

A general mode of the organic EL display device is to control a current applied to the organic EL element by the thin film transistor formed on the transparent insulating substrate such as a glass substrate. Then, for applications such as a display of a television system and a smartphone, amorphous silicon or polycrystalline silicon is generally used as a channel material of the thin film transistor, for example. In contrast, in a case of a high-definition and small-sized display device having a pixel pitch of, for example, 10 μm or less and a resolution exceeding, for example, 2500 pixels per inch (ppi), the current applied to the organic EL element is sometimes controlled by a MOS transistor formed on the semiconductor substrate such as the silicon substrate.

In the organic EL display device, a common electrode provided in common for all the pixels is fixed to, for example, 0 V, and a positive voltage is applied to an individual electrode provided for each pixel located on an opposite side of the common electrode with the organic EL layer interposed therebetween, so that the organic EL element emits light. Hereinafter, the individual electrode provided for each pixel is referred to as an anode electrode, and the common electrode provided in common for all the pixels is referred to as the cathode electrode.

As described above, a typical example of a using manner is to fix potential of the cathode electrode (cathode potential) to 0 V, but the using manner is not limited to this; for example, the using manner of setting a potential difference with the anode electrode to be larger than that in a case where the cathode potential is fixed to 0 V by setting the cathode potential to negative potential, and increasing luminance is also possible. The embodiment described below is based on, but not limited to, the using method of fixing the cathode potential to 0 V.

[System Configuration]

FIG. 1 is a system configuration diagram illustrating an outline of a configuration of the organic EL display device as an example of the display device to which the technology of the present disclosure is applied. As illustrated in FIG. 1, an organic EL display device 10 according to this application example has a system configuration including a pixel array unit 30 in which a plurality of pixels 20 each including the organic EL element is two-dimensionally arranged in a matrix, and a peripheral circuit (peripheral drive unit) arranged around the pixel array unit 30.

The peripheral circuit includes, for example, a write scan unit 40, a drive scan unit 50, a signal output unit 60 and the like mounted on a display panel 70 on which the pixel array unit 30 is mounted, and drives each pixel 20 of the pixel array unit 30. Note that, some or all of the write scan unit 40, the drive scan unit 50, and the signal output unit 60 may be provided outside the display panel 70.

As a substrate of the display panel 70, a transparent insulating substrate such as a glass substrate may be used, or a semiconductor substrate such as a silicon substrate may be used. The organic EL display device using the semiconductor substrate as the substrate of the display panel 70 is referred to as a so-called micro display (small display), and is suitably used as an electronic viewfinder of a digital still camera, a display unit of a head mounted display and the like.

The organic EL display device 10 may be configured to support monochrome (black-and-white) display or to support color display. In a case where the organic EL display device 10 supports color display, one pixel (unit pixel/pixel) as a unit for forming a color image includes a plurality of sub-pixels.

When one pixel includes a plurality of sub-pixels, each of the sub-pixels corresponds to the pixel 20 in FIG. 1. More specifically, in the display device supporting color display, one pixel includes, for example, three sub-pixels including a sub-pixel that emits red (R) light, a sub-pixel that emits green (G) light, and a sub-pixel that emits blue (B) light.

However, one pixel is not limited to a combination of sub-pixels of three primary colors of RGB, and one pixel may be formed by further adding a sub-pixel of one color or sub-pixels of a plurality of colors to the sub-pixels of the three primary colors. More specifically, for example, one pixel may be formed by adding a sub-pixel that emits white (W) light for improving luminance, or one pixel may be formed by adding at least one sub-pixel that emits complementary color light for expanding a color reproduction range.

In the pixel array unit 30, a scan line 31 ($31_1$ to $31_m$) and a drive line 32 ($32_1$ to $32_m$) are wired for each pixel row in a row direction (an array direction of the pixels of the pixel row) for an array of the pixels 20 of m rows and n columns. Moreover, a signal line 33 ($33_1$ to $33_n$) is wired for each pixel column in a column direction (an array direction of the pixels of the pixel column) for the array of the pixels 20 of m rows and n columns.

Each of the scan lines 31 ($31_1$ to $31_m$) is connected to an output terminal of a corresponding row of the write scan unit 40. Each of the drive lines 32 ($32_1$ to $32_m$) is connected to an output terminal of a corresponding row of the drive scan unit 50. Each of the signal lines 33 ($33_1$ to $33_n$) is connected to an output terminal of a corresponding column of the signal output unit 60.

The write scan unit 40 includes a shift register circuit and the like. When a signal voltage of a video signal is written in each pixel 20 of the pixel array unit 30, the write scan unit 40 sequentially supplies write scan signals WS ($WS_1$ to $WS_m$) to the scan lines 31 ($31_1$ to $31_m$), respectively, thereby sequentially scanning the pixels 20 of the pixel array unit 30 row by row, that is, performing line sequential scanning.

The drive scan unit 50 includes a shift register circuit and the like as is the case with the write scan unit 40. The drive scan unit 50 supplies light emission control signals DS ($DS_1$ to $DS_m$) to the drive lines 32 ($32_1$ to $32_m$), respectively, in synchronization with the line sequential scanning by the write scan unit 40, thereby controlling light emission/non-light emission (extinction) of the pixel 20.

The signal output unit 60 selectively outputs a signal voltage of the video signal (hereinafter, sometimes also simply described as a "signal voltage") $V_{sig}$ corresponding to luminance information supplied from a signal supply source (not illustrated) and a reference voltage $V_{ofs}$. Here, the reference voltage $V_{ofs}$ is a voltage corresponding to a voltage as a reference of the signal voltage $V_{sig}$ of the video signal (for example, a voltage corresponding to a black level of the video signal) or a voltage in the vicinity thereof. The reference voltage $V_{ofs}$ is used as an initialization voltage when a correction operation is performed.

The signal voltage $V_{sig}$/reference voltage $V_{ofs}$ alternatively output from the signal output unit 60 is written in the pixels 20 of the pixel array unit 30 via the signal lines 34 ($34_1$ to $34_n$) in units of pixel rows selected by the line sequential scanning by the write scan unit 40. That is, the signal output unit 60 adopts a drive mode of line sequential writing in which the signal voltage $V_{sig}$ is written in units of pixel rows (lines).

[Pixel Circuit]

Figure 2:
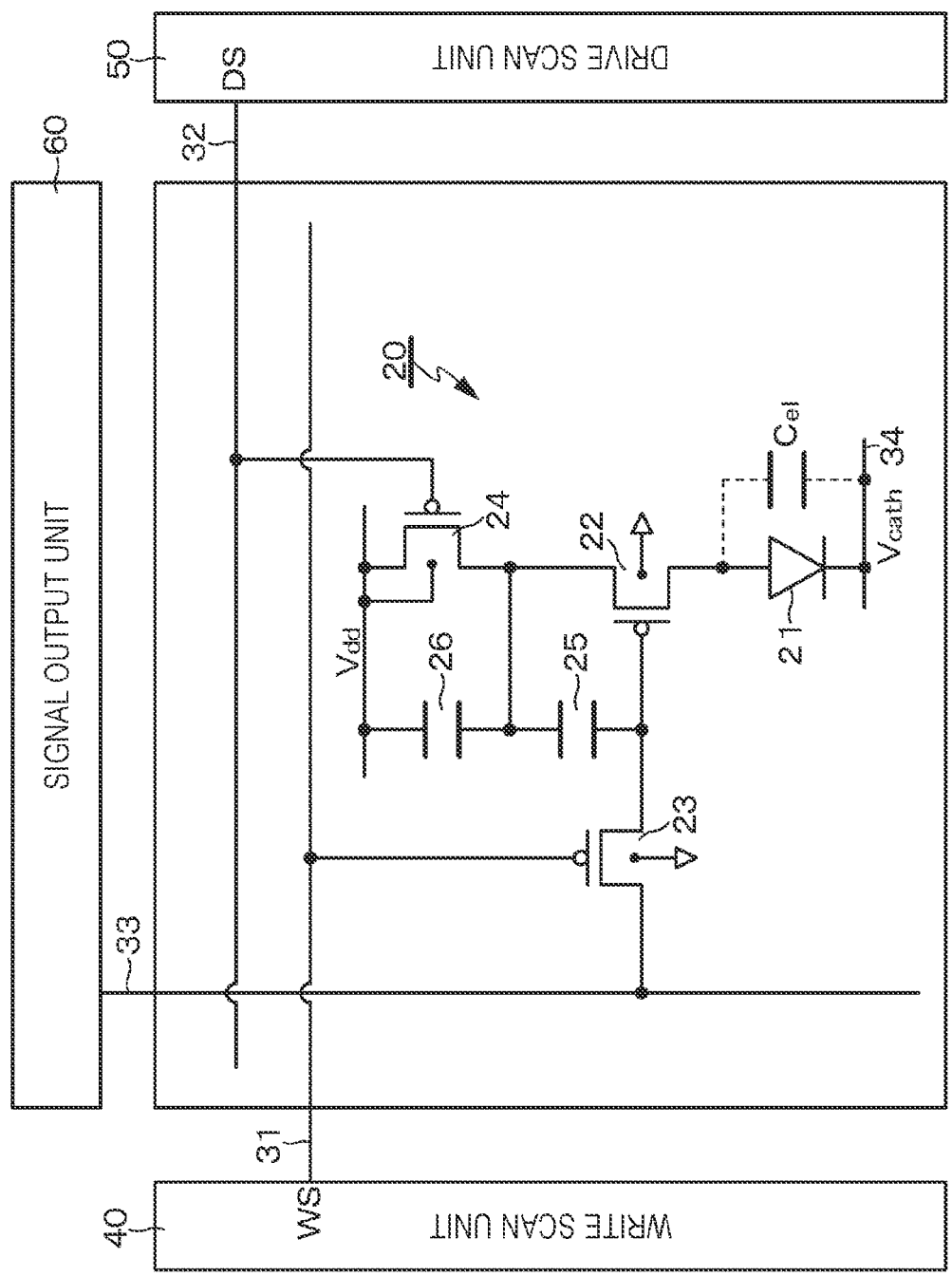
FIG. 2 is a circuit diagram illustrating an example of a circuit configuration of a pixel (pixel circuit) in the organic EL display device.

FIG. 2 is a circuit diagram illustrating an example of a circuit configuration of the pixel (pixel circuit) in the organic EL display device 10 according to this application example. The light emitting unit of the pixel 20 includes an organic EL element 21. The organic EL element 21 is an example of a current-driven electro-optical element in which light emission luminance changes according to a current value applied to a device.

As illustrated in FIG. 2, the pixel 20 includes the organic EL element 21 and a drive circuit unit (pixel drive circuit unit) that drives the organic EL element 21 by applying the current to the organic EL element 21. In the organic EL element 21, a cathode electrode is connected to a common power supply line 34 wired in common for all the pixels 20. Therefore, predetermined potential (for example, reference potential) is applied as cathode potential $V_{cath}$ to the cathode electrode of the organic EL element 21 via the common power supply line 34. In the drawing, $C_{el}$ represents an equivalent capacitance of the organic EL element 21.

The drive circuit unit that drives the organic EL element 21 has a circuit configuration including a drive transistor 22, a sampling transistor 23, a light emission control transistor 24, a holding capacitance 25, and an auxiliary capacitance 26. Here, it is assumed that the organic EL element 21 and the drive circuit unit thereof are formed not on the transparent insulating substrate such as the glass substrate but on the semiconductor substrate such as the silicon substrate, and a P-channel transistor is used as the drive transistor 22.

Furthermore, in this example, the P-channel transistor is used also for the sampling transistor 23 and the light emission control transistor 24 as is the case with the drive transistor 22. Therefore, the drive transistor 22, the sampling transistor 23, and the light emission control transistor 24 are not of three terminals of source/gate/drain, but of four terminals of source/gate/drain/back gate. A power supply voltage $V_{dd}$ is applied to the back gate.

However, the sampling transistor 23 and the light emission control transistor 24 are switching transistors that serve as switch elements, so that they are not limited to the P-channel transistors. That is, the sampling transistor 23 and the light emission control transistor 24 may be N-channel transistors or may have a configuration in which the P-channel type and N-channel type are mixed.

In the pixel 20 having the above-described configuration, the sampling transistor 23 samples the signal voltage $V_{sig}$ supplied from the signal output unit 60 via the signal line 33, thereby writing the same in the holding capacitance 25. The light emission control transistor 24 is connected between a node of the power supply voltage $V_{dd}$ and a source electrode of the drive transistor 22, and controls light emission/non-light emission of the organic EL element 21 under drive by the light emission control signal DS.

The holding capacitance 25 is connected between a gate electrode and the source electrode of the drive transistor 22. The holding capacitance 25 holds the signal voltage $V_{sig}$ written by a sampling operation by the sampling transistor 23. The drive transistor 22 drives the organic EL element 21 by applying a drive current corresponding to a holding voltage of the holding capacitance 25 to the organic EL element 21.

The auxiliary capacitance 26 is connected between the source electrode of the drive transistor 22 and a node of fixed potential, for example, the node of the power supply voltage $V_{dd}$. The auxiliary capacitance 26 has an effect of suppressing fluctuation of source potential of the drive transistor 22 when the signal voltage $V_{sig}$ is written, and setting a gate-source voltage $V_{gs}$ of the drive transistor 22 to a threshold voltage $V_t$ of the drive transistor 22.

[Panel Structure According to Conventional Example]

Figure 3A:
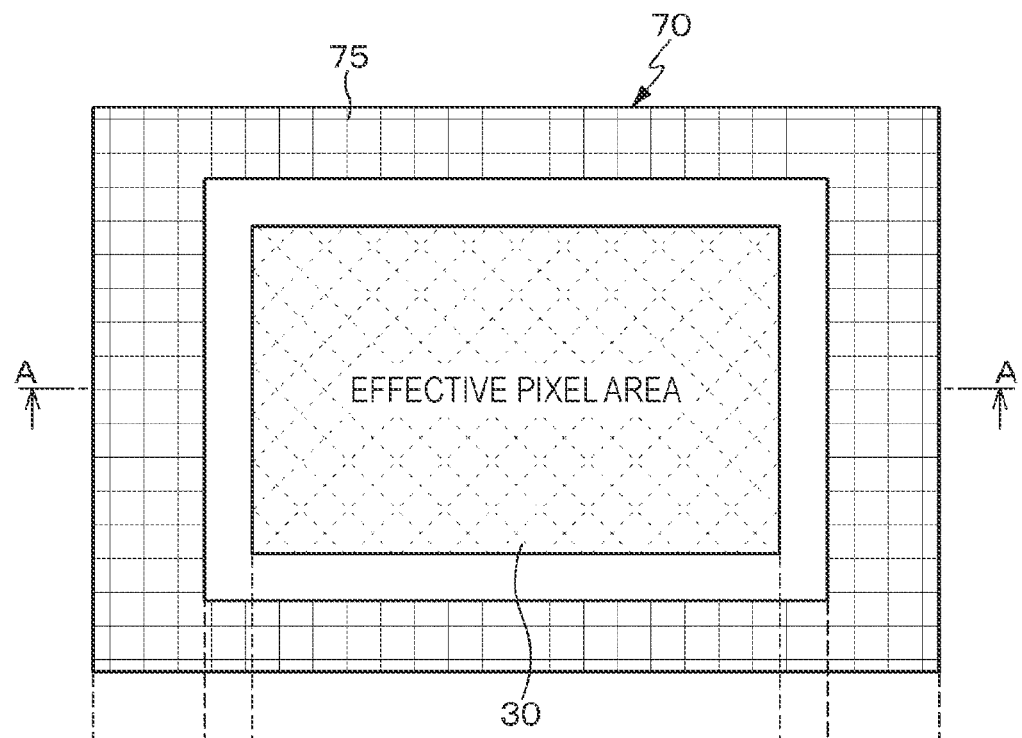
FIG. 3A is a plan view illustrating a planar structure of a display panel according to a conventional example.
Figure 3B:
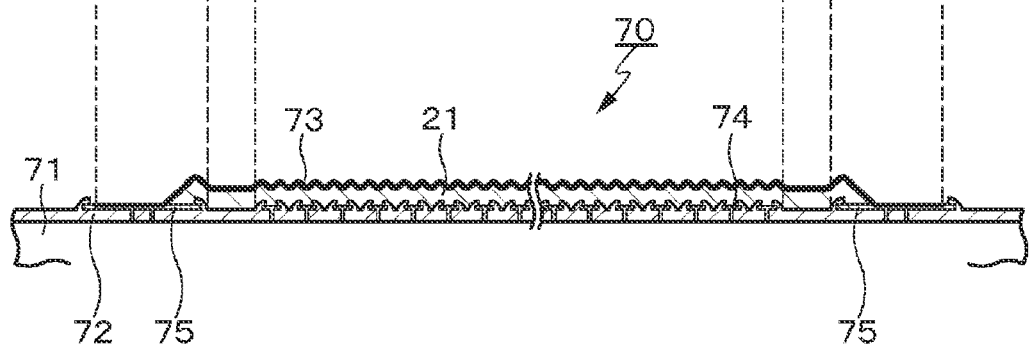
FIG. 3B is a cross-sectional view as seen in an arrow direction taken along line A-A in FIG. 3A.

Here, a structure of a display panel 70 (panel structure) according to a conventional example is described. FIG. 3A illustrates a plan view of the structure of the display panel 70 according to the conventional example, and FIG. 3B illustrates a cross-sectional view as seen in an arrow direction taken along line A-A in FIG. 3A.

The display panel 70 has a configuration in which a circuit unit (not illustrated) that drives an organic EL element 21 is formed on a semiconductor substrate 71 such as a silicon substrate, an interlayer film 72, which is an insulating film, is formed in a state of covering the circuit unit, and the organic EL elements 21 are arrayed on the interlayer film 72. Then, on the organic EL elements 21, a cathode electrode 73 is formed as an upper electrode as an electrode common to all the pixels. Furthermore, in the organic EL element 21, an anode electrode 74 is provided as a lower electrode for each pixel of a pixel array unit 30, which is an effective pixel area. As is apparent from FIG. 2, the anode electrode 74 is electrically connected to a circuit unit that drives the organic EL element 21 in units of pixels.

It is necessary to apply predetermined potential to the cathode electrode 73 as a cathode potential $V_{cath}$. Specifically, for example, in a case of adopting the configuration of the pixel circuit in FIG. 2, it is necessary to electrically connect the cathode electrode 73 to a common power supply line 34 of the cathode potential $V_{cath}$. Therefore, in the panel structure of the display panel 70 according to the conventional example, a contact electrode 75 to which predetermined potential is applied as the cathode potential $V_{cath}$ is provided in a rectangular ring shape in an outer peripheral portion of the effective pixel area, which is the area of the pixel array unit 30, and the cathode electrode 73 is electrically connected to the contact electrode 75.

In the panel structure according to the conventional example having the above-described configuration, there is a case where a sheet resistance of the cathode electrode 73 provided in common for all the pixels increases due to various factors over an entire surface of the effective pixel area. Then, when the sheet resistance of the cathode electrode 73 increases, luminance of the pixel in the central portion of the effective pixel area and in the vicinity thereof decreases as an angle of view is larger and as the current to be applied is larger, which causes shading. Furthermore, it is necessary to arrange the contact electrode 75 on the outer peripheral portion of the effective pixel area, which suppresses a frame of the display panel 70 from being narrowed (reduction in chip size).

<Display Device According to Embodiment of Present Disclosure>

As the embodiment of the present disclosure, the display device illustrated in FIGS. 1 and 2, that is, the organic EL display device in which the light emitting unit (light emitting element) includes the organic EL element, which is an example of the current-driven electro-optical element, is described as an example.

In the organic EL element, an organic layer (organic EL layer), which is a light emitting functional layer, includes a light emitting layer (for example, a light emitting layer of an organic light emitting material). Specifically, this organic layer may have, for example, a stacked structure of a hole transport layer, the light emitting layer, and an electron transport layer, a stacked structure of the hole transport layer and the light emitting layer also serving as the electron transport layer, a stacked structure of a hole injection layer, the hole transport layer, the light emitting layer, the electron transport layer, and an electron injection layer and the like. Furthermore, in a case where the organic layer having such stacked structure and the like is made a tandem unit, the organic layer may have a two-stage tandem structure in which a first tandem unit, a charge generation layer (CGL) as an intermediate layer, and a second tandem unit are stacked, and may further have a three or more-stage tandem structure in which three or more tandem units are stacked.

As a method of forming the organic layer, various applying methods such as a physical vapor deposition method (PVD method) such as a vacuum deposition method; a printing method such as a screen printing method or an inkjet printing method; a laser transfer method of applying a laser beam to a stacked structure of a laser absorption layer and an organic layer formed on a transfer substrate to separate the organic layer on the laser absorption layer and transfer the organic layer may be exemplified. In a case where the organic layer is formed by the vacuum deposition method, for example, it is possible use a so-called metal mask to obtain the organic layer by depositing a material passing through an opening provided on the metal mask, or form the organic layer on an entire surface without patterning.

The display device according to the embodiment of the present disclosure is, for example, the organic EL display device using the organic EL element as the light emitting unit, and includes the light emitting unit, multilayer cathode electrodes stacked in two or more layers with an interlayer film (protective film) interposed therebetween on the light emitting unit and electrically connected to each other, and a potential supply wire that applies predetermined potential (for example, reference potential) to the multilayer cathode electrodes. Then, the cathode electrodes of second and subsequent layers out of the multilayer cathode electrodes are electrically connected to the potential supply wire at a bottom of a first contact hole. When the cathode electrodes have a multilayer electrode structure electrically connected to each other, the sheet resistance of the cathode electrode may be reduced.

Since the cathode electrode of a first layer and the organic layer are formed by mask sputtering and vapor deposition, they cannot be formed with a fine structure, and fine processing and the like is implemented when forming the same including the contact hole by subsequent photoresist processing. Since the cathode electrodes of the second and subsequent layers may be formed with a fine structure, by electrically connecting the cathode electrodes of the second or subsequent layers to the potential supply wire to form a cathode contact portion for predetermined potential, it becomes possible to provide the cathode contact portion in the effective pixel area. Therefore, a distance between the pixel especially in the central portion in the effective pixel area and the cathode contact portion may be made short, shading caused by the sheet resistance of the cathode electrode may be suppressed together with the reduction in sheet resistance of the cathode electrode. Furthermore, by providing the cathode contact portion in the effective pixel area, it is possible to narrow the frame of the display panel 70 (reduce the chip size).

Hereinafter, a specific example of the organic EL display device according to the embodiment of the present disclosure having the panel structure including the multilayer cathode electrodes is described. Hereinafter, as the multilayer cathode electrodes, for example, two-layer cathode electrodes including a first cathode electrode and a second cathode electrode are described as an example. However, the multilayer cathode electrodes are not limited to two-layer cathode electrodes, and may be cathode electrodes of three or more layers.

Example 1

Figure 4:
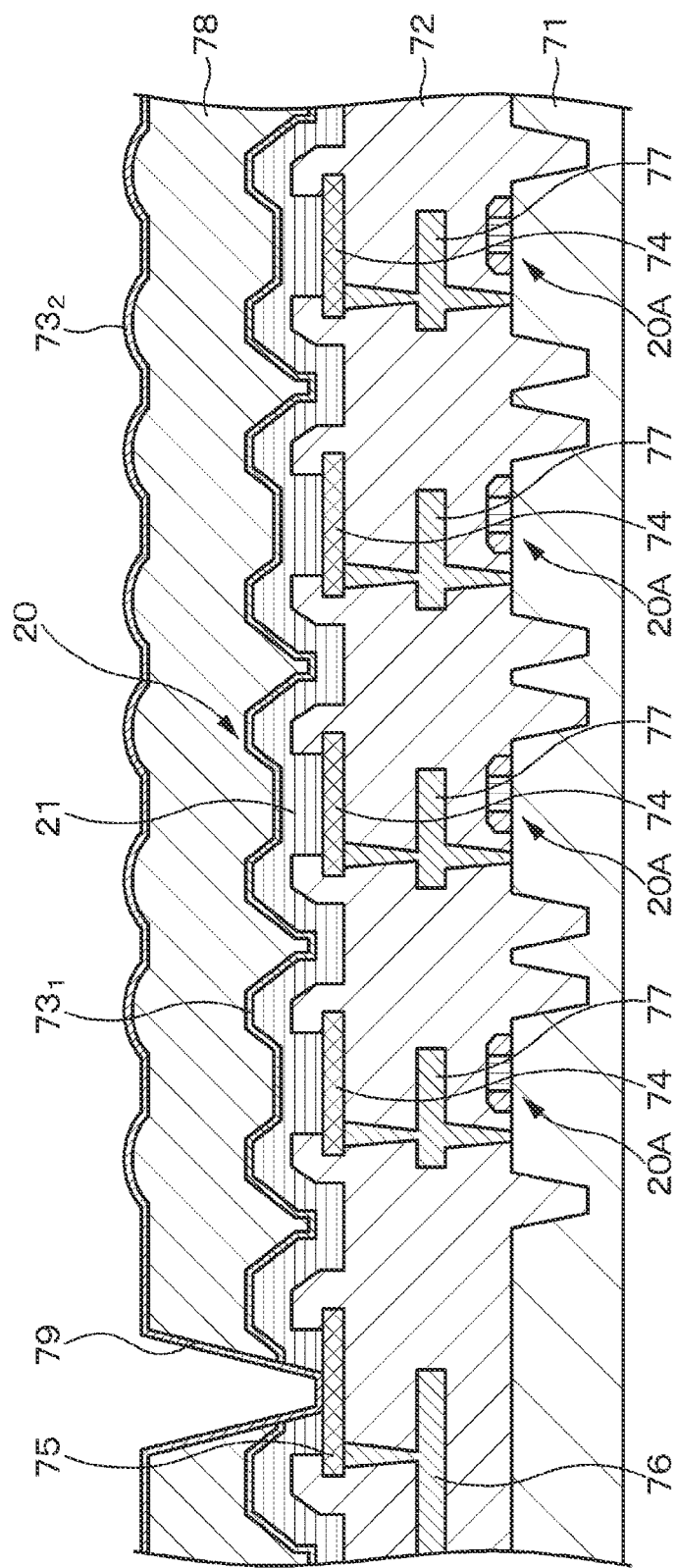
FIG. 4 is a cut portion end face view illustrating a panel structure of a display device according to Example 1.

Example 1 is an example of the cathode electrodes of two layers in which the cathode electrode of the second layer is electrically connected to the potential supply wire at the bottom of the contact hole, and the cathode electrode of the first layer is electrically connected to the cathode electrode of the second layer on the side wall of the contact hole. FIG. 4 is a cut portion end face view illustrating a panel structure of a display device according to Example 1.

As illustrated in FIG. 4, on a semiconductor substrate 71 on which a pixel circuit unit 20A that drives the organic EL element 21 is formed, the interlayer film 72, which is the insulating film, is formed in a state of covering the pixel circuit unit 20A. Then, on the interlayer film 72, the pixels (sub-pixels) 20 each including the organic EL element 21 are arrayed. The pixel 20 includes, for example, three sub-pixels: a pixel 20R that emits red (R) light, a pixel 20G that emits green light, and a pixel 20B that emits blue light.

Figure 5:
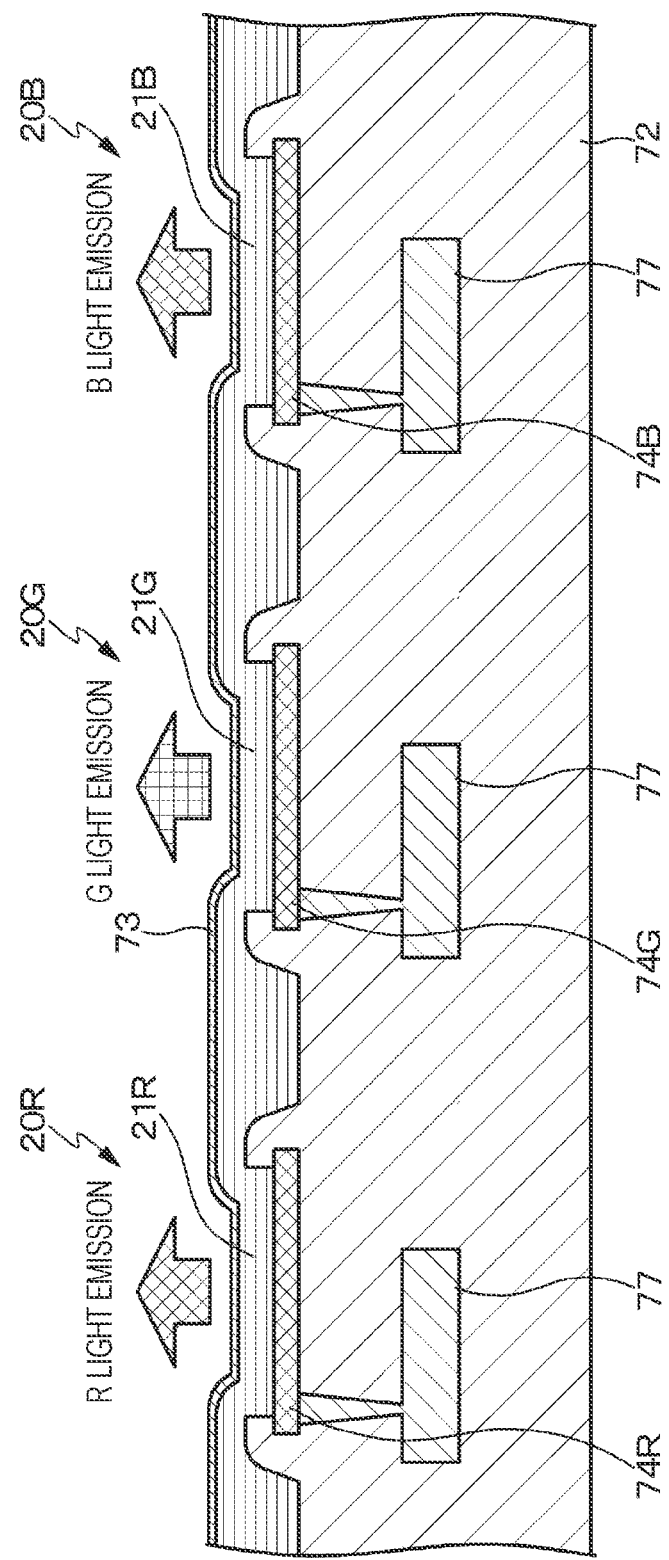
FIG. 5 is a cross-sectional view illustrating a cross-sectional structure of a panel structure including red, green, and blue organic EL elements.

There roughly are two types of methods of forming the pixels 20R, 20G, and 20B. One of them is a method of forming the organic EL layer in units of pixels (sub-pixels) by separately applying monochromatic light emitting organic materials of a plurality of colors, for example, R, G, and B with a deposition mask as illustrated in FIG. 5. The other method is a method of forming a white organic EL element (white organic EL layer) 21W in common for all the pixels by depositing a white (W) light emitting organic material having a light emission spectrum of a plurality of colors over an entire surface of the light emitting pixel area, and dispersing by color filters 90R, 90G, and 90B having a spectral spectrum of a plurality of colors, for example, R, G, and B as illustrated in FIG. 6.

The organic EL display device according to this embodiment may be the organic EL display device having the panel structure in which RGB are separately applied, or may be the organic EL display device having the panel structure of the tandem structure of one stage or two or more stages of white (W).

The organic EL element (organic EL layer) 21 of the pixel 20 is formed by vacuum deposition of an organic EL material. In the organic EL element 21, the anode electrode 74 as the lower electrode is formed on the interlayer film 72 independently for each pixel. As a material of the anode electrode 74, for example, a metal material such as aluminum (Al) and stacking of indium tin oxide (ITO) and silver (Ag) may be used.

The contact electrode 75 is formed in the same layer as the anode electrode 74 on the interlayer film 72. As a material of the contact electrode 75, for example, the same material as that of the anode electrode 74, that is, the metal material such as aluminum and stacking of indium tin oxide and silver may be exemplified. A potential supply wire 76 that supplies predetermined potential (reference potential) is electrically connected to the contact electrode 75. The potential supply wire 76 is formed in the same layer as a wire 77 of the pixel circuit unit 20A that drives the organic EL element 21, for example.

The anode electrode 74 is electrically connected to the wire 77 of the pixel circuit unit 20A that drives the organic EL element 21. In a case where the pixel 20 is of the circuit example illustrated in FIG. 2, the wire 77 of the pixel circuit unit 20A corresponds to a wire that connects the organic EL element 21 to the drive transistor 22 and the like.

On the organic EL element 21, a first cathode electrode $73_1$, which is the cathode electrode of the first layer, is formed as the upper electrode by vacuum deposition. As a material of the first cathode electrode $73_1$, for example, a permeable material such as indium zinc oxide (IZO) and indium tin oxide (ITO) may be used. Furthermore, a semi-permeable material such as magnesium silver (MgAg) may also be used.

On the first cathode electrode $73_1$, a protective film 78 is formed by vacuum deposition over an entire pixel array. For example, an inorganic material such as silicon oxide (SiO), silicon nitride (SiN), silicon oxynitride (SiNO), titanium oxide (TiO), or aluminum oxide (AlO) may be used as a material of the protective film 78.

On the protective film 78, a second cathode electrode $73_2$, which is the cathode electrode of the second layer, is formed by vacuum deposition. As a material of the second cathode electrode $73_2$, the same material as that of the first cathode electrode $73_1$, that is, a material such as indium tin oxide (ITO) and indium zinc oxide (IZO) may be used. However, the material of the second cathode electrode $73_2$ is not necessarily the same as that of the first cathode electrode $73_1$, and a different material may also be used.

The protective film 78, which is the interlayer film between the first cathode electrode $73_1$ and the second cathode electrode $73_2$, may be adjusted to form a cavity structure optimal for light extraction using a resonance effect of light between the first cathode electrode $73_1$ and the second cathode electrode $73_2$.

As illustrated in FIG. 4, in the protective film 78, a first contact hole 79 connected to the contact electrode 75 electrically connected to the potential supply wire 76 that supplies predetermined potential via a layer of the organic EL element 21 is formed. The second cathode electrode $73_2$ is formed on a side wall of the first contact hole 79 by vacuum deposition as on an upper surface of the protective film 78. Therefore, the second cathode electrode $73_2$ is electrically connected to the potential supply wire 76 via the contact electrode 75 at a bottom of the contact hole 78.

Furthermore, the first cathode electrode $73_1$ is electrically connected to the second cathode electrode $73_2$ on the side wall of the first contact hole 79. That is, the first cathode electrode $73_1$ and the second cathode electrode $73_2$ are electrically connected to each other on the side wall of the first contact hole 79.

Then, predetermined potential (reference potential) is applied from the potential supply wire 85 to the first cathode electrode $73_1$ via the contact electrode 75 at the bottom of the first contact hole 79. Furthermore, predetermined potential is applied from the first cathode electrode $73_1$ to the second cathode electrode $73_2$ on the side wall of the first contact hole 79.

Example 2

Figure 7A:
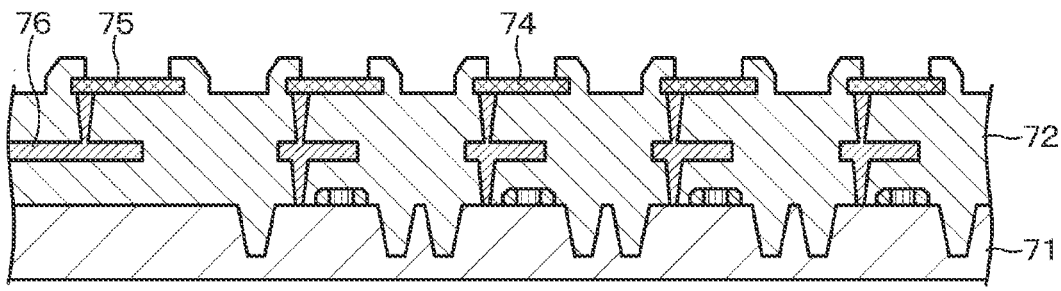
FIGS. 7A, 7B, and 7C are step diagrams (part 1) illustrating a flow of a manufacturing method according to Example 2.
Figure 7B:
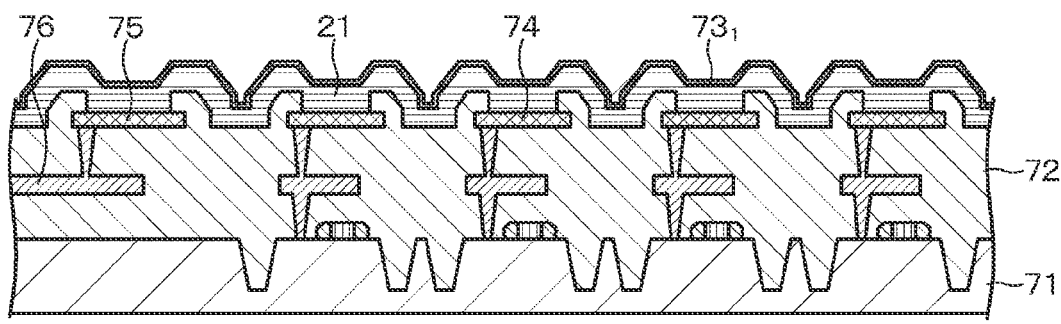
Figure 7C:
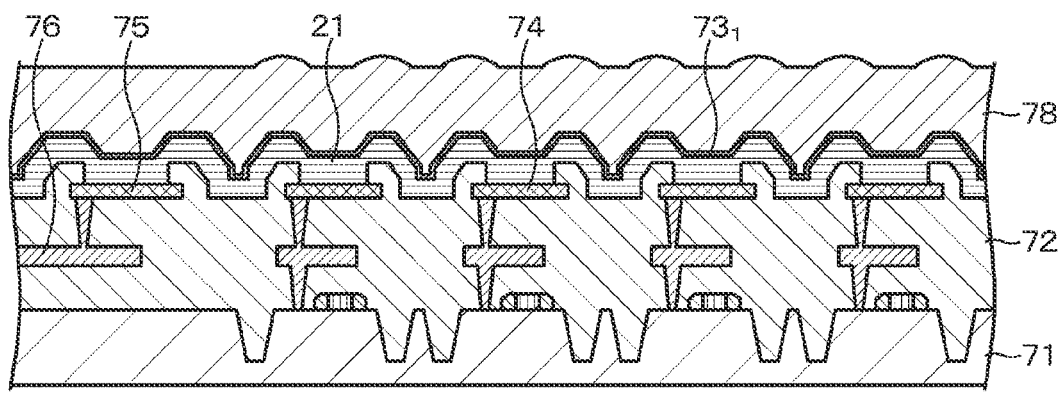
Figure 8A:
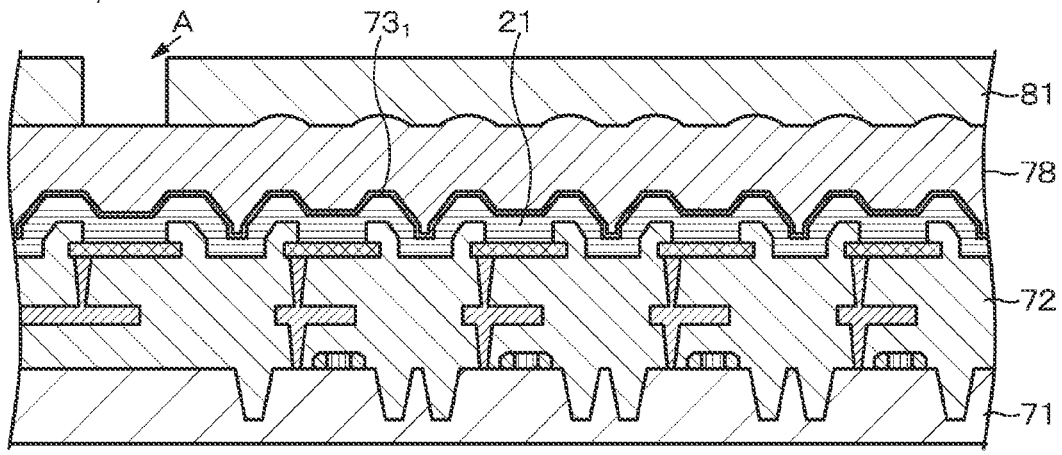
FIGS. 8A, 8B, and 8C are step diagrams (part 2) illustrating a flow of a manufacturing method according to Example 2.
Figure 8B:
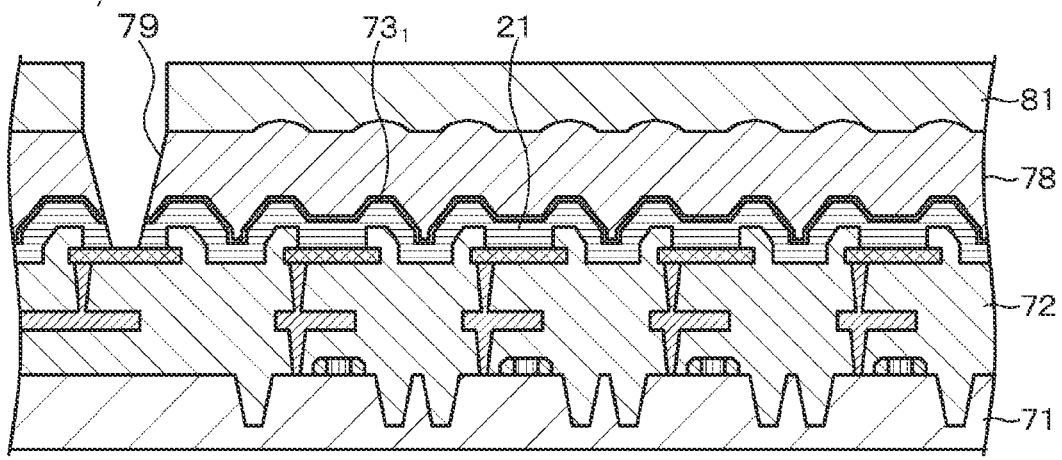
Figure 8C:
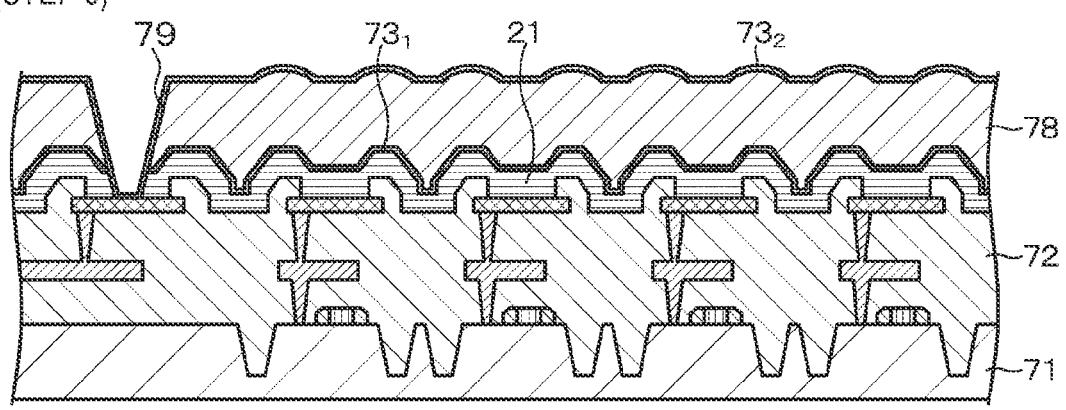

Example 2 is an example of a method of manufacturing the panel structure of the display device according to Example 1. Step diagrams (part 1) of the manufacturing method according to Example 2 are illustrated in FIGS. 7A, 7B, and 7C, and steps diagrams (part 2) are illustrated in FIGS. 8A, 8B, and 8C. Here, manufacturing steps after forming the anode electrode 74 are described.

A state at step 1 illustrated in FIG. 7A illustrates a state in which a base is prepared by a general forming process of the anode electrode 74. At step 2 illustrated in FIG. 7B, the organic EL element 21, which is the light emitting unit, and the first cathode electrode $73_1$ are formed by vapor deposition and sputtering. Next, at step 3 illustrated in FIG. 7C, the protective film 78 is formed on the first cathode electrode $73_1$ over the entire pixel array using a material such as silicon nitride and titanium oxide.

Next, at step 4 illustrated in FIG. 8A, a photoresist 81 is applied onto the protective film 78 except for a portion A where the first contact hole 79 is to be formed, and then, at step 5 illustrated in FIG. 8B, the first contact hole 79 for electrically connecting the first cathode electrode $73_1$ to the second cathode electrode $73_2$ is formed in the protective film 78 by anisotropic etching. Next, at step 6 illustrated in FIG. 8C, after the photoresist 81 is removed, the second cathode electrode $73_2$ is formed by sputtering or vapor deposition over an entire surface of the protective film 78 including an inner wall and the bottom of the first contact hole 79.

According to the manufacturing method according to Example 2 described above, the first cathode electrode $73_1$ may be electrically connected to the contact electrode 75 at the bottom of the first contact hole 79, and the first cathode electrode $73_1$ and the second cathode electrode $73_2$ may be electrically connected to each other on the side wall of the first contact hole 79.

Example 3

Figure 9:
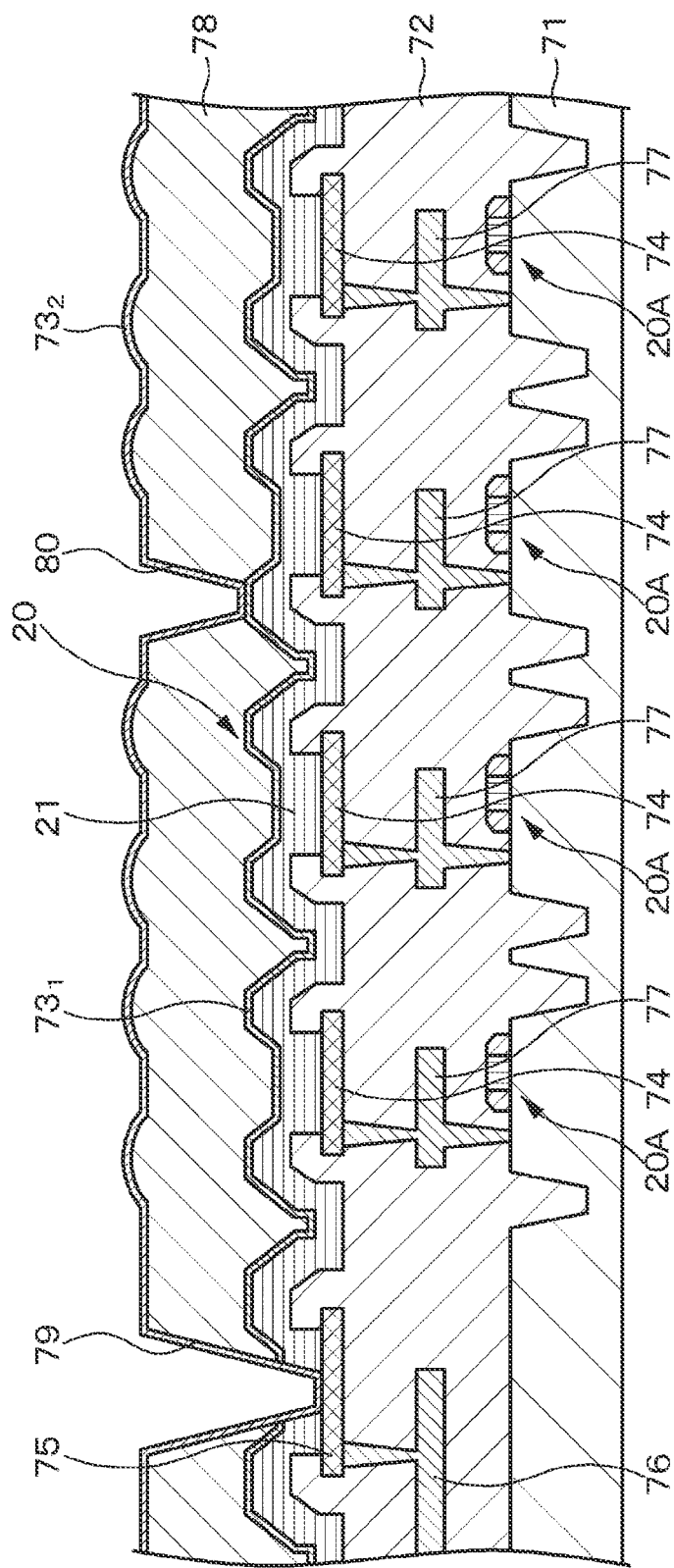
FIG. 9 is a cut portion end face view illustrating a panel structure of a display device according to Example 3.

Example 3 is a variation of Example 1 in which the cathode electrode of the first layer is electrically connected to the cathode electrode of the second layer via a dedicated contact hole (second contact hole). FIG. 9 is a cut portion end face view illustrating a panel structure according to Example 2.

The panel structure of the display device according to Example 1 has the configuration in which the first cathode electrode $73_1$ is electrically connected to the second cathode electrode $73_2$ on the side wall of the first contact hole 79 that connects the second cathode electrode $73_2$ to the contact electrode 75. In contrast, in the panel structure of the display device according to Example 3, as illustrated in FIG. 9, a second contact hole 80 connected to the first cathode electrode $73_1$ is formed in the protective film 78, the second cathode electrode $73_2$ is formed over the entire surface of the protective film 78 including a side wall and a bottom of the second contact hole 80, and the second cathode electrode $73_2$ is electrically connected to the first cathode electrode $73_1$ at the bottom of the second contact hole 80.

According to the panel structure of the display device according to Example 3, predetermined potential is applied from the potential supply wire 76 to the second cathode electrode $73_2$ via the contact electrode 75 at the bottom of the first contact hole 79. Then, this predetermined potential is applied to the first cathode electrode $73_1$ on the side wall of the first contact hole 79, and applied to the first cathode electrode $73_1$ at the bottom of the second contact hole 80 via the second cathode electrode $73_2$.

Note that, in the panel structure of the display device according to Example 3, the first cathode electrode $73_1$ is electrically connected to the second cathode electrode $73_2$ on the side wall of the first contact hole 79 in addition to the bottom of the second contact hole 80, but there is no limitation. That is, it is possible that the first cathode electrode $73_1$ is electrically connected to the second cathode electrode $73_2$ only at the bottom of the second contact hole 80.

Example 4

Example 4 is an example of a method of manufacturing the panel structure of the display device according to Example 3. Step diagrams (part 1) of the manufacturing method according to Example 4 are illustrated in FIGS. 10A, 10B, and 10C, and steps diagrams (part 2) are illustrated in FIGS. 11A, 11B, and 11C.

Here, manufacturing steps after forming the anode electrode 74 are described. Furthermore, the formation of the first contact hole 79 for electrically connecting the first cathode electrode $73_1$ to the potential supply wire 85 via the contact electrode 75 is the same as that in the manufacturing method of Example 2, so that the description thereof is herein omitted.

Figure 10A:
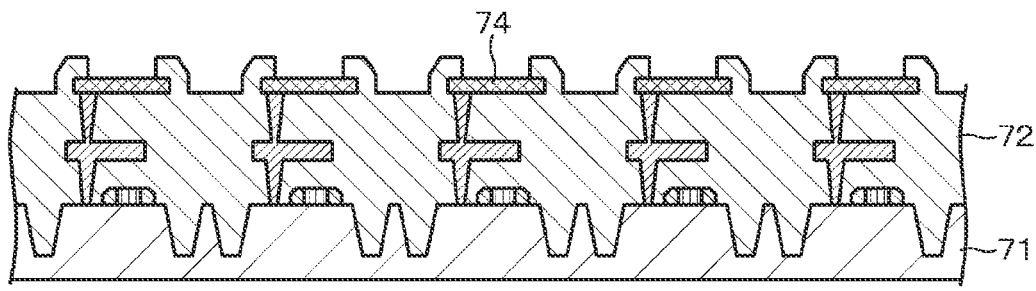
FIGS. 10A, 10B, and 10C are step diagrams (part 1) illustrating a flow of a manufacturing method according to Example 4.
Figure 10B:
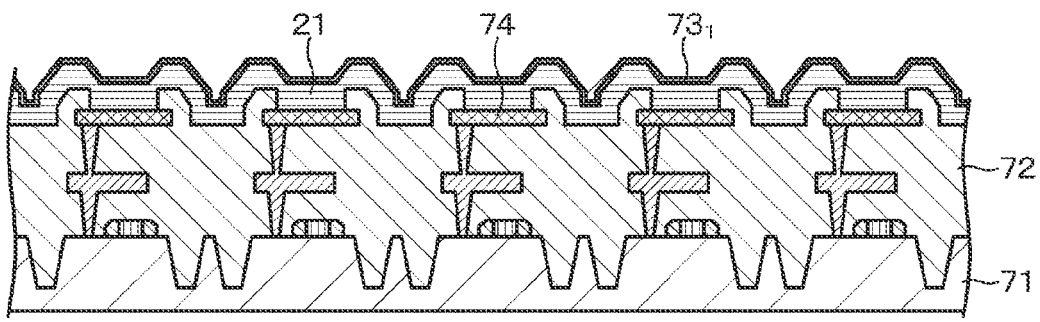
Figure 10C:
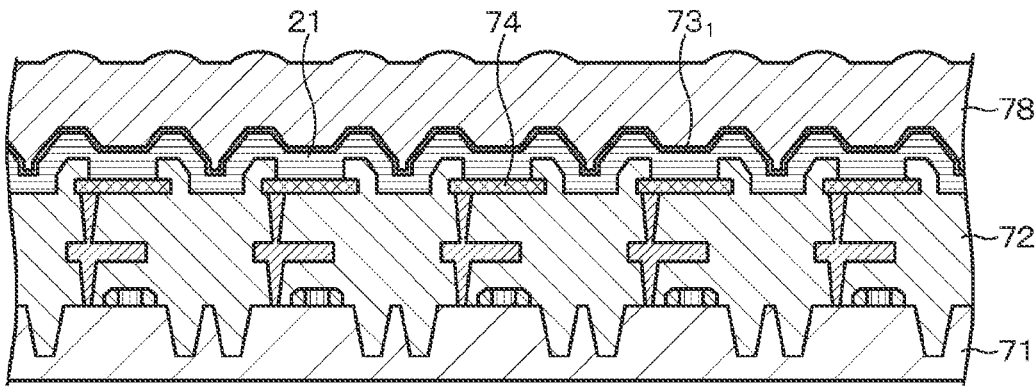

A state at step 1 illustrated in FIG. 10A illustrates a state in which a base is prepared by a general forming process of the anode electrode 74. At step 2 illustrated in FIG. 10B, the organic EL element 21, which is the light emitting unit, and the first cathode electrode $73_1$ are formed by vapor deposition and sputtering. Next, at step 3 illustrated in FIG. 10C, the protective film 78 is formed on the first cathode electrode $73_1$ over the entire pixel array using a material such as silicon nitride and titanium oxide.

Figure 11A:
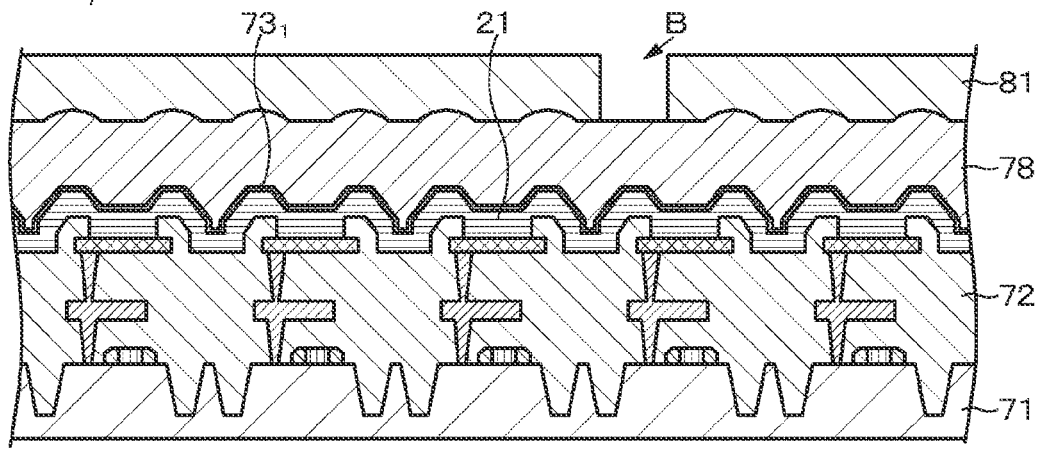
FIGS. 11A, 11B, and 11C are step diagrams (part 2) illustrating a flow of a manufacturing method according to Example 4.
Figure 11B:
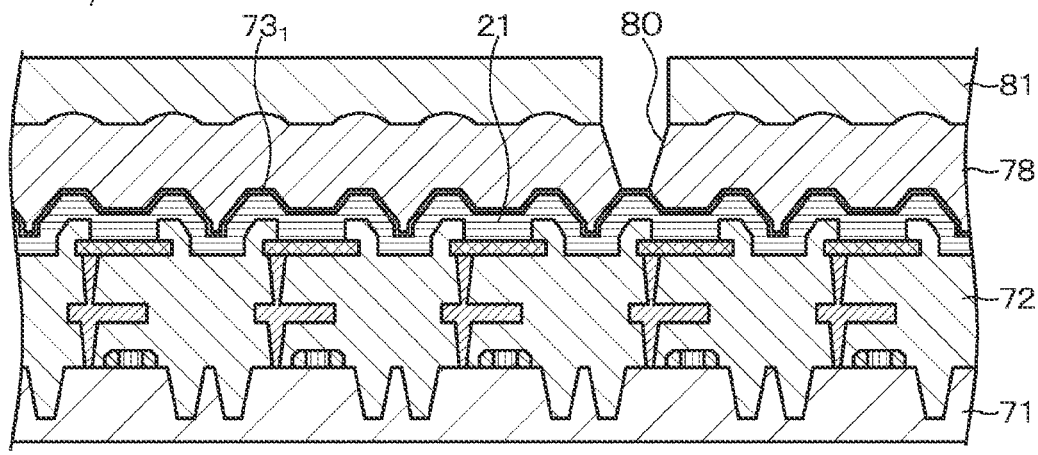
Figure 11C:
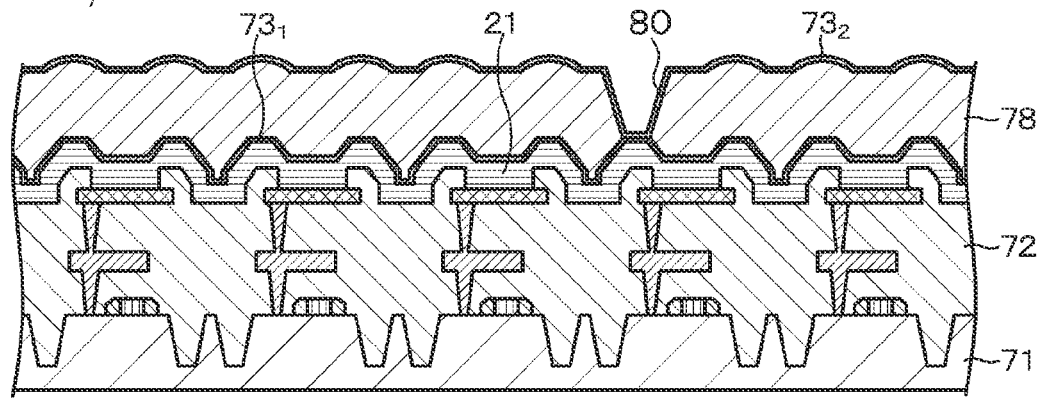

Next, at step 4 illustrated in FIG. 11A, a photoresist 81 is applied onto the protective film 78 except for a portion B where the second contact hole 80 is to be formed, and then, at step 5 illustrated in FIG. 11B, the second contact hole 80 for electrically connecting the first cathode electrode $73_1$ to the second cathode electrode $73_2$ is formed in the protective film 78 by anisotropic etching. Next, at step 6 illustrated in FIG. 11C, after the photoresist 81 is removed, the second cathode electrode $73_2$ is formed by sputtering or vapor deposition over an entire surface of the protective film 78 including an inner wall and the bottom of the second contact hole 80.

According to the manufacturing method according to Example 4 described above, the first cathode electrode $73_1$ may be electrically connected to the second cathode electrodes $73_2$ at the bottom of the second contact hole 80.

Example 5

Figure 12:
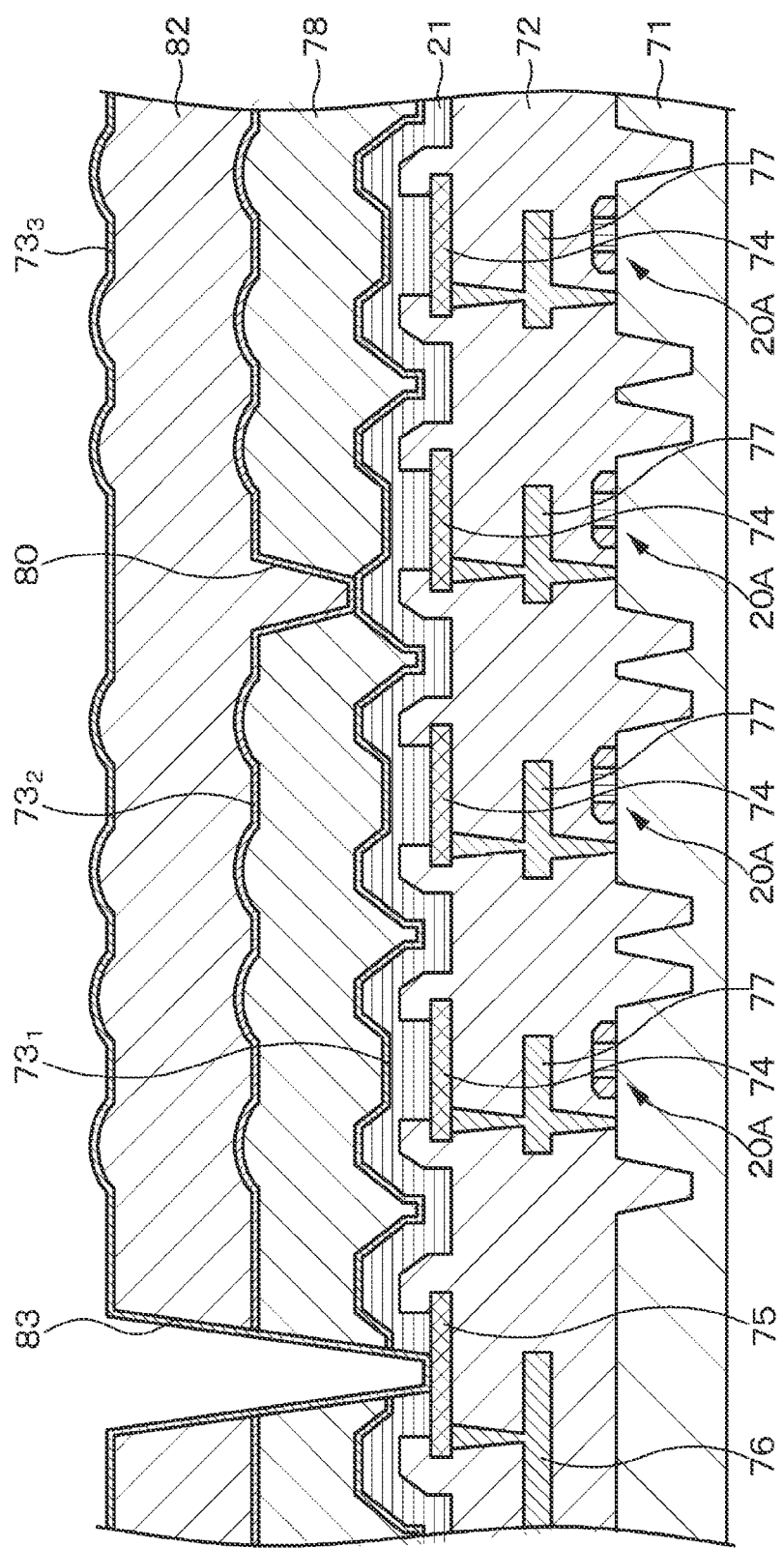
FIG. 12 is a cut portion end face view illustrating a panel structure of a display device according to Example 5.

Example 5 is an example of the cathode electrodes of three layers in which the cathode electrode of a third layer is electrically connected to the potential supply wire at a bottom of a contact hole (third contact hole), and the cathode electrode of the third layer is electrically connected to the cathode electrodes of the first and second layers on a side wall of the contact hole. FIG. 12 is a cut portion end face view illustrating a panel structure of a display device according to Example 5.

As illustrated in FIG. 12, on the second cathode electrode $73_2$, a protective film 82 is formed by vacuum deposition over an entire pixel array. The same material as that of the protective film 78, that is the inorganic material such as silicon oxide, silicon nitride, silicon oxynitride, titanium oxide, or aluminum oxide may be used as a material of the protective film 82.

On the protective film 82, a third cathode electrode $73_3$, which is the cathode electrode of the third layer, is formed by vacuum deposition. As a material of the third cathode electrode $73_3$, the same material as that of the first cathode electrode $73_1$ and the second cathode electrode $73_2$, that is, the material such as indium tin oxide and indium zinc oxide may be used. However, the material of the third cathode electrode $73_3$ is not necessarily the same as that of the first cathode electrode $73_1$ and the second cathode electrode $73_2$, and a different material may also be used.

In the protective films 82 and 78, a third contact hole 83 connected to the contact electrode 75 electrically connected to the potential supply wire 76 that supplies predetermined potential via a layer of the organic EL element 21 is formed. The third cathode electrode $73_2$ is formed on a side wall and a bottom of the third contact hole 83 by vacuum deposition as on an upper surface of the protective film 82. Therefore, the third cathode electrode $73_3$ is electrically connected to the potential supply wire 76 via the contact electrode 75 at the bottom of the third contact hole 78.

Furthermore, the first cathode electrode $73_1$ and the second cathode electrode $73_2$ are electrically connected to the third cathode electrode $73_3$ on the side wall of the third contact hole 83. That is, the first and second cathode electrodes $73_1$ and $73_2$ and the third cathode electrode $73_3$ are electrically connected to each other on the side wall of the third contact hole 83.

The first cathode electrode $73_1$ and the second cathode electrode $73_2$ are electrically connected to each other also at the bottom of the second contact hole 80 as is the case with the panel structure of the display device according to Example 3. Note that, since the first cathode electrode $73_1$ and the second cathode electrode $73_2$ are electrically connected to each other on the side wall of the third contact hole 83 via the third cathode electrode $73_3$, the electrical connection at the bottom of the second contact hole 80 may be omitted.

Example 6

Example 6 is an example of a method of manufacturing the panel structure of the display device according to Example 5. Step diagrams (part 1) of the manufacturing method according to Example 5 are illustrated in FIGS. 13A and 13B, and steps diagrams (part 2) are illustrated in FIGS. 14A and 14B.

Note that, steps before the step of forming the second cathode electrode $73_2$ (step 6 illustrated in FIG. 11) in the manufacturing method according to Example 4 are the same as those in the manufacturing method according to Example 4, so that the illustration and description of the steps are omitted here.

Figure 13A:
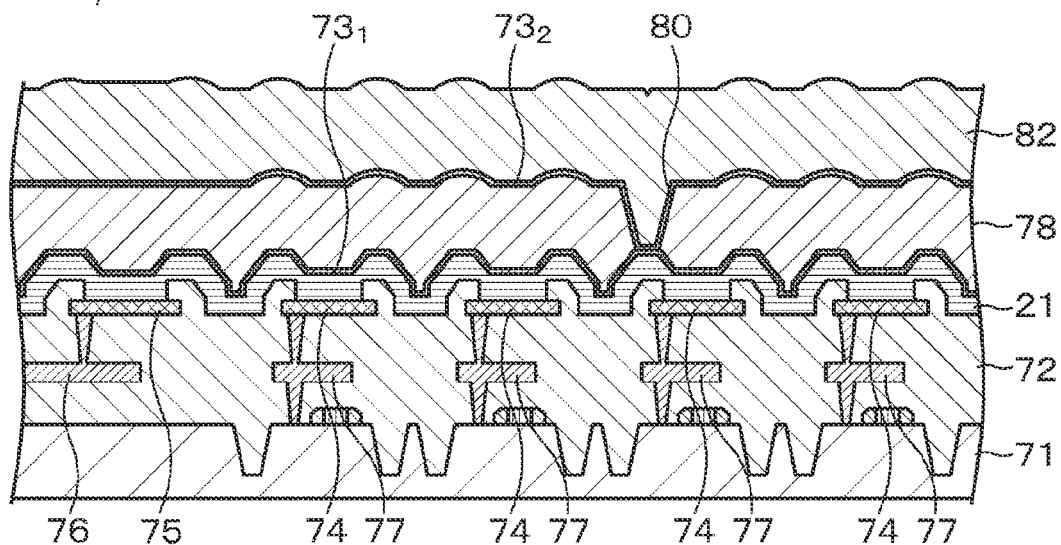
FIGS. 13A and 13B are step diagrams (part 1) illustrating a flow of a manufacturing method according to Example 6.
Figure 13B:
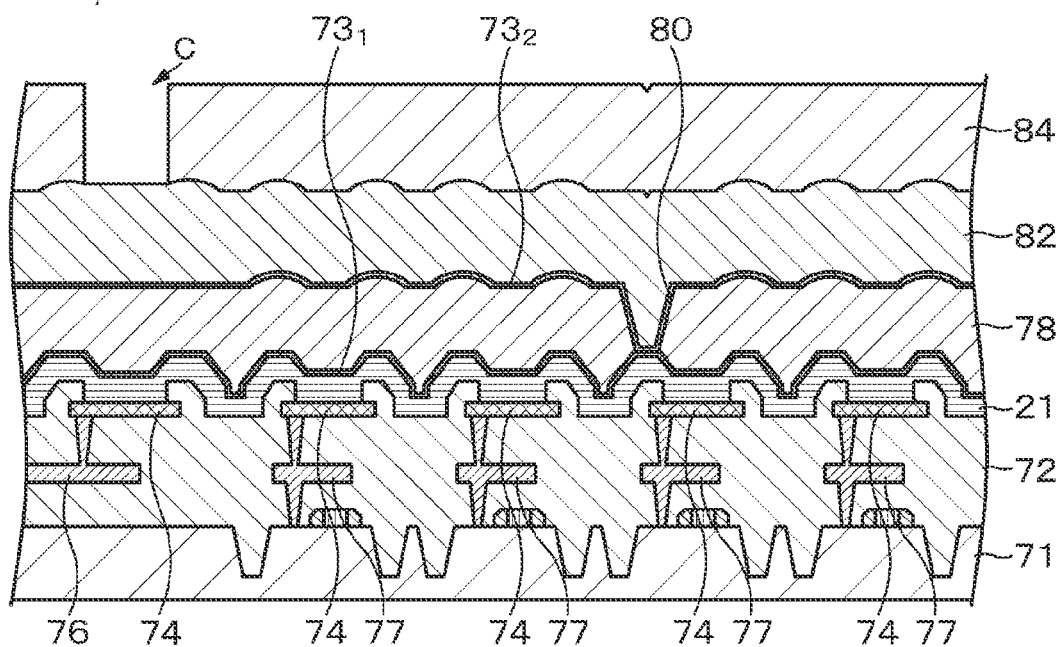

After the second cathode electrode $73_2$ is formed, at step 1 illustrated in FIG. 13A, the protective film 82 is formed on the second cathode electrode $73_2$ over the entire pixel array using a material such as silicon nitride and titanium oxide. Next, at step 2 illustrated in FIG. 13B, a photoresist 84 is applied onto the protective film 82 except for a portion C where the third contact hole 83 is to be formed.

Figure 14A:
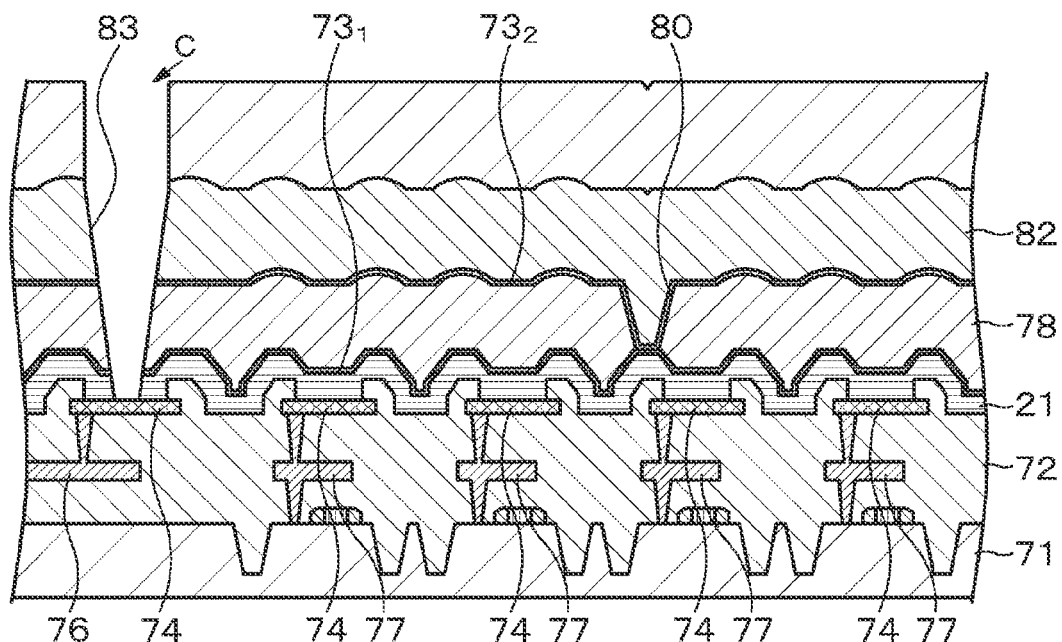
FIGS. 14A and 14B are step diagrams (part 2) illustrating a flow of a manufacturing method according to Example 6.
Figure 14B:
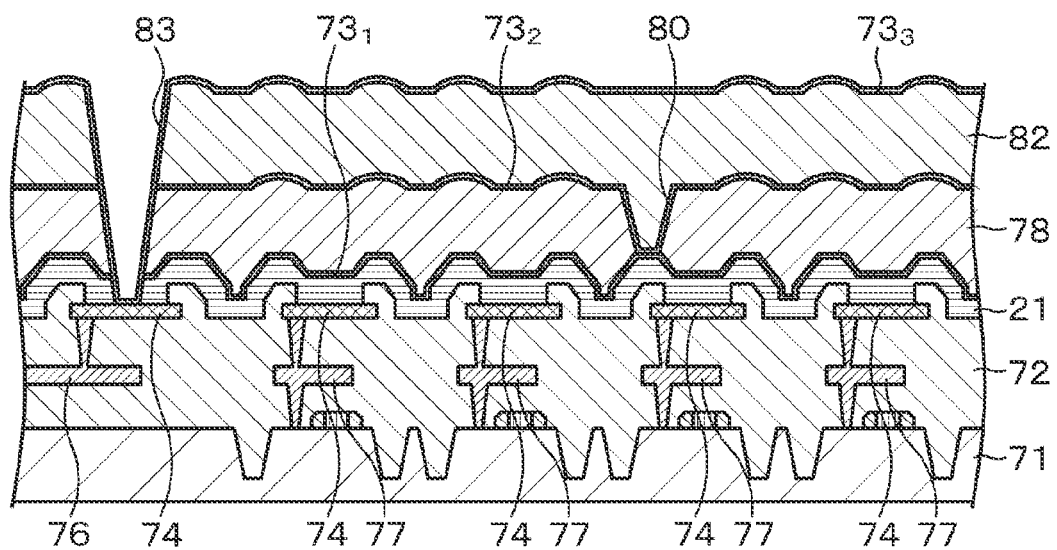

Next, at step 3 illustrated in FIG. 14A, the third contact hole 83 for electrically connecting the third cathode electrode $73_3$ to the contact electrode 75 is formed by anisotropic etching. Next, at step 4 illustrated in FIG. 14B, after the photoresist 84 is removed, the third cathode electrode $73_3$ is formed by sputtering or vapor deposition over an entire surface of the protective film 84 including an inner wall and the bottom of the third contact hole 83.

According to the manufacturing method according to Example 4 described above, the third cathode electrode $73_3$ may be electrically connected to the contact electrode 75 at the bottom of the third contact hole 83. Furthermore, the first cathode electrode $73_1$ and the second cathode electrode $73_2$ may be electrically connected to the third cathode electrode $73_3$ on the side wall of the third contact hole 83.

Example 7

Example 7 is an arrangement example of electrical connection portions of the cathode electrodes of the second and subsequent layers to the potential supply wire, and electrical connection portions between the cathode electrodes of the respective layers.

In the panel structure of the display device according to Example 1, the second cathode electrode $73_2$ is electrically connected to the potential supply wire 76 at the bottom of the first contact hole 79. In the panel structure of the display device according to Example 1, moreover, the first cathode electrode $73_1$ and the second cathode electrode $73_2$ are electrically connected to each other on the side wall of the first contact hole 79.

In the panel structure of the display device according to Example 2, the first cathode electrode $73_1$ and the second cathode electrode $73_2$ are electrically connected to each other at the bottom of the second contact hole 80.

In the panel structure of the display device according to Example 3, the third cathode electrode $73_3$ is electrically connected to the potential supply wire 76 at the bottom of the third contact hole 83. In the panel structure of the display device according to Example 3, moreover, the first cathode electrode $73_1$, the second cathode electrode $73_2$, and the third cathode electrode $73_3$ are electrically connected to each other on the side wall of the third contact hole 83.

Here, for convenience, a connection portion in which the cathode electrodes of the second and subsequent layers (second cathode electrode $73_2$/third cathode electrode $73_3$) are electrically connected to the potential supply wire 76 at the bottom of the first contact hole 79/third contact hole 83 is referred to as a first cathode contact portion. Furthermore, a connection portion in which the first cathode electrode $73_1$ is electrically connected to the second cathode electrode $73_2$ at the bottom of the second contact hole 80 is referred to as a second cathode contact portion, and a connection portion in which the cathode electrodes of the respective layers are electrically connected to each other on the side wall of the first contact hole 79/third contact hole 83 is referred to as a third cathode contact portion.

The first cathode contact portion using the bottom of the first contact hole 79/third contact hole 83 may be arranged inside, outside, or both of them of the effective pixel area in the tandem structure of one stage or two stages of white (W), and may be arranged inside or outside the effective pixel area in the tandem structure of three or more stages and the structure in which RGB are separately applied.

In the tandem structure of one stage or two stages of white (W), when the arrangement position of the first cathode contact portion is inside and outside the effective pixel area, or when the arrangement position is only inside, the second cathode contact portion using the bottom of the contact hole 80 and the third cathode contact portion using the side wall of the first contact hole 79/third contact hole 83 may be adopted. When the arrangement position of the first cathode contact portion is only outside the effective pixel area, the second cathode contact portion using the bottom of the contact hole 79 may be adopted. In the structure in which RGB is separately applied, the second cathode contact portion using the bottom of the contact hole 80 and the third cathode contact portion using the side wall of the first contact hole 79/third contact hole 83 may be adopted.

Especially, the first cathode contact portion may also be provided outside the effective pixel area, but it is preferable to provide the same in the effective pixel area in order to shorten the distance between the pixel 20 especially in the central portion in the effective pixel area and the first cathode contact portion to reduce the sheet resistance of the cathode electrode. Furthermore, by providing the first cathode contact portion in the effective pixel area, it is possible to narrow the frame of the display panel 70 (reduce the chip size).

Figure 15A:
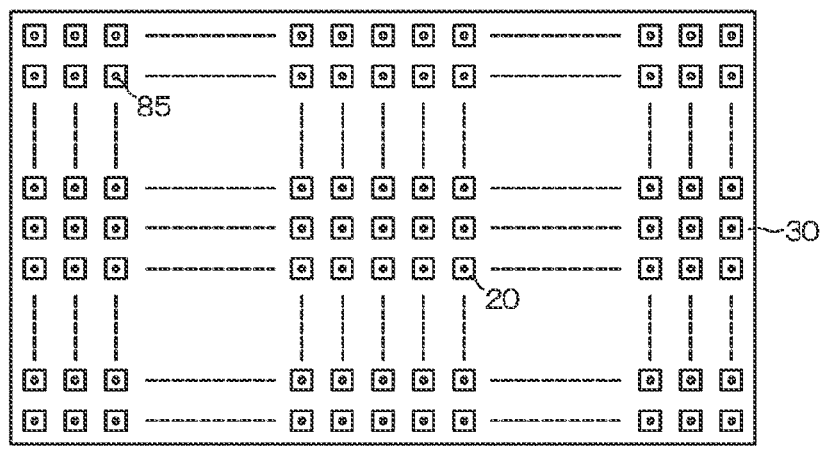
FIGS. 15A, 15B, and 15C are plan views illustrating an arrangement example (part 1), an arrangement example (part 2), and an arrangement example (part 3) of a cathode contact portion according to Example 7.
Figure 15B:
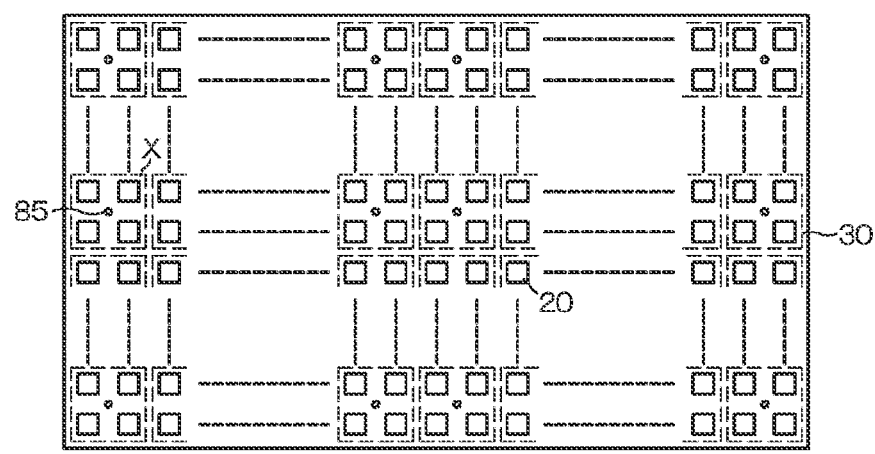
Figure 15C:
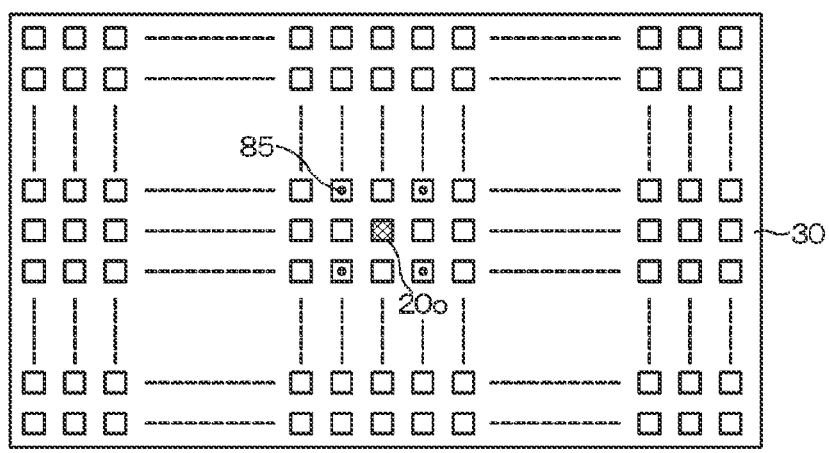

FIGS. 15A, 15B, and 15C illustrate an arrangement example (part 1), an arrangement example (part 2), and an arrangement example (part 3) of the cathode contact portion according to Example 7.

For example, when the first cathode contact portion 85 is provided in the effective pixel area, a most preferable mode is to arrange one first cathode contact portion 85 in one pixel 20 as illustrated in the arrangement example (part 1) in FIG. 15A. According to this arrangement example (part 1), the distance between the pixel 20 and the first cathode contact portion 85 may be made short and constant regardless of the position of the pixel 20 in the effective pixel area.

Furthermore, as illustrated in the arrangement example (part 2) in FIG. 15B, it is also possible to adopt an arrangement example in which an area X having a predetermined size including a plurality of pixels 20 adjacent to each other is set as a unit, and one first cathode contact portion 85 is arranged in each area X. Here, a case where the area X having a predetermined size includes four pixels adjacent to each other is exemplified, but the area X is not limited to the area including four pixels, and the size thereof may be any size. However, as the number of pixels forming the area X is smaller, the mode may be made closer to the most preferable mode in FIG. 15A, and the distance between the pixel 20 and the first cathode contact portion 85 may be made short and constant.

Furthermore, as illustrated in the arrangement example (part 3) in FIG. 15C, it is also possible to adopt an arrangement example in which one first cathode contact portion 85 is arranged in each of a plurality of pixels 20 in the vicinity of a pixel 20o in the central portion of the effective pixel area. According to this arrangement example (part 3), a distance between the pixel 20 especially in the central portion and the first cathode contact portion 85 may be made short, and the sheet resistance of the cathode electrode may be reduced, so that it is possible to suppress occurrence of IR drop and suppress shading caused by the sheet resistance.

<Variation>

Although the technology of the present disclosure is described above on the basis of the preferred embodiment, the technology of the present disclosure is not limited to the embodiment. The configuration and structure of the display device described in the above-described embodiment are exemplary and may be changed as appropriate. For example, in the above-described embodiment, a case applied to the organic EL display device is described, but this is not limited to the application to the organic EL display device, and for example, the application to all the display devices having a configuration in which predetermined potential is applied to the cathode electrode is possible.

Furthermore, in the above-described embodiment, it is described with the tandem structure of one stage of white (W) is described as an example, but the technology of the present disclosure may also be applied to the tandem structure of two or more stages of white (W) obtained by stacking the tandem units with the charge generation layer (CGL) as the intermediate layer.

<Electronic Device of Present Disclosure>

The display device of the present disclosure described above may be used as a display unit (display device) of an electronic device in any field that displays a video signal input to the electronic device or a video signal generated in the electronic device as an image or a video. Examples of the electronic device include a television set, a notebook personal computer, a digital still camera, a mobile terminal device such as a mobile phone, a head mounted display and the like. However, this is not limited to them.

In this manner, by using the display device of the present disclosure as the display unit of the electronic device in any field, the following effects may be obtained. That is, the display device of the present disclosure may satisfy all of improvement in pixel resolution, an increase in luminance, and the narrow frame. Therefore, by using the display device of the present disclosure, it is possible to contribute to improvement in performance of the display unit of the electronic device and miniaturization of an electronic device main body.

The display device of the present disclosure also includes a module shape having a sealed configuration. As an example thereof includes a display module formed by adhering an opposing portion such as transparent glass to the pixel array unit. Note that, the display module may be provided with a circuit unit for inputting and outputting signals and the like from the outside to the pixel array unit, a flexible printed circuit (FPC) and the like. Hereinafter, a digital still camera and a head mounted display are exemplified as specific examples of the electronic device using the display device of the present disclosure. However, the specific examples exemplified here are merely examples, and there is no limitation.

Specific Example 1

Figure 16A:
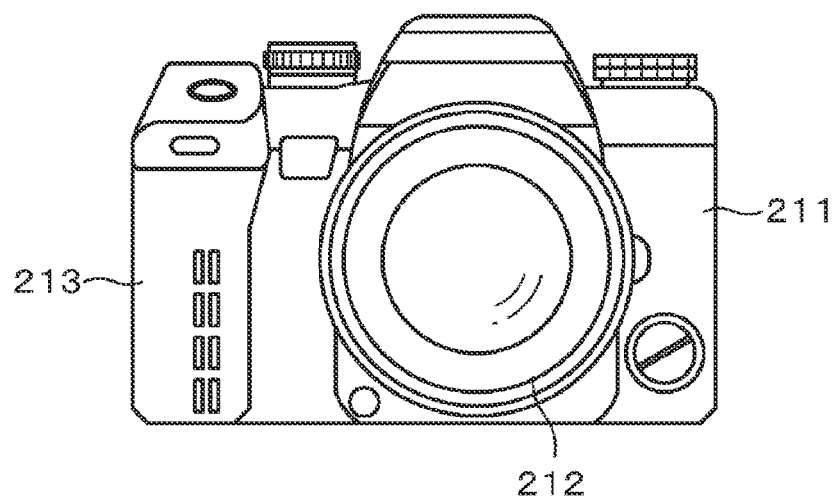
FIG. 16A is a front view of a lens interchangeable single lens reflex digital still camera according to Specific Example 1 of an electronic device of the present disclosure.
Figure 16B:
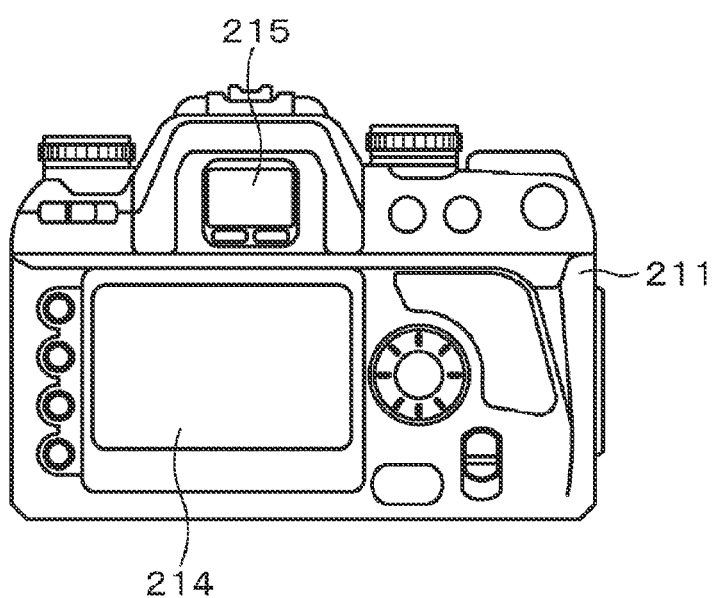
FIG. 16B is a rear view thereof.

FIG. 16 is an external view of a lens interchangeable single lens reflex digital still camera according to Specific Example 1 of the electronic device of the present disclosure, in which FIG. 16A illustrates a front view thereof and FIG. 16B illustrates a rear view thereof.

The lens interchangeable single lens reflex digital still camera according to this Specific Example 1 includes, for example, an interchangeable imaging lens unit (interchangeable lens) 212 on a front right side of a camera main body (camera body) 211, and a grip 213 to be held by a photographer on a front left side.

Then, a monitor 214 is provided substantially at the center of a back surface of the camera main body 211. An electronic viewfinder (eyepiece window) 215 is provided above the monitor 214. By looking into the electronic viewfinder 215, the photographer may determine a composition by visually recognizing an optical image of a subject guided from the imaging lens unit 212.

In the lens interchangeable single lens reflex digital still camera having the above-described configuration, the display device of the present disclosure may be used as the electronic viewfinder 215. That is, the lens interchangeable single lens reflex digital still camera according to this Specific Example 1 is manufactured by using the display device of the present disclosure as the electronic viewfinder 215.

Specific Example 2

Figure 17:
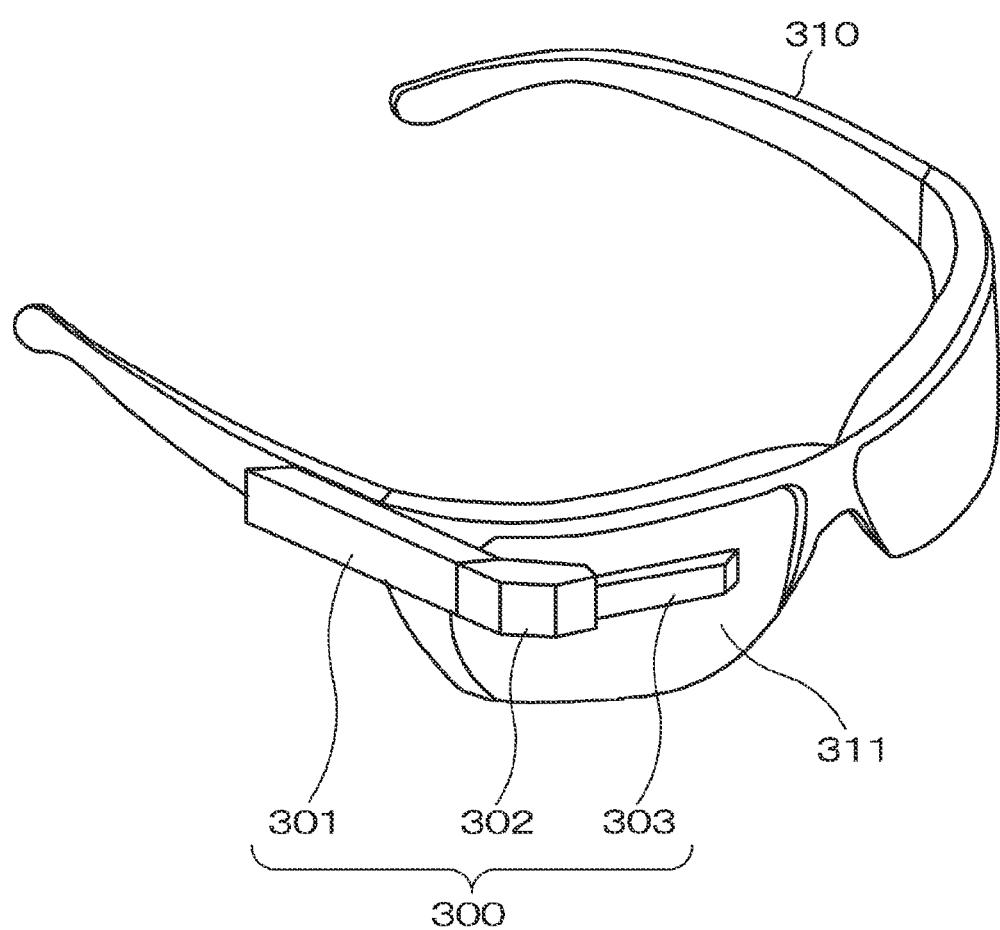
FIG. 17 is an external view illustrating an example of a head mounted display according to Specific Example 2 of the electronic device of the present disclosure.

FIG. 17 is an external view illustrating an example of a head mounted display according to Specific Example 2 of the electronic device of the present disclosure.

A head mounted display 300 according to this Specific Example 2 has a transmissive head mounted display configuration including a main body 301, an arm 302, and a lens barrel 303. The main body 301 is connected to the arm 302 and glasses 310. Specifically, an end of the main body 301 in a long side direction is attached to the arm 302. Furthermore, one side of a side surface of the main body 301 is connected to the glasses 310 via a connection member (not illustrated). Note that, the main body 301 may be directly mounted on a head of a human body.

The main body 301 incorporates a control board and a display unit for controlling an operation of the head mounted display 300. The arm 302 supports the lens barrel 303 with respect to the main body 301 by connecting the main body 301 to the lens barrel 303. Specifically, the arm 302 is connected to the end of the main body 301 and an end of the lens barrel 303 to fix the lens barrel 303 with respect to the main body 301. Furthermore, the arm 302 incorporates a signal line for communicating data related to an image provided from the main body 301 to the lens barrel 303.

The lens barrel 303 projects image light provided from the main body 301 via the arm 302 toward an eye of a user wearing the head mounted display 300 through a lens 311 of the glasses 310.

In the head mounted display 300 having the above-described configuration, the display device of the present disclosure may be used as the display unit built in the main body 301. That is, the head mounted display 300 according to this Specific Example 2 is manufactured by using the display device of the present disclosure as the display unit thereof.

<Configuration that Present Disclosure May Take>

Note that, the present technology may also take a following configuration.

<<A. Display Device>>

[A-1] A display device including:
  a light emitting unit;
  multilayer cathode electrodes stacked on the light emitting unit in two or more layers with a protective film interposed between the cathode electrodes and electrically connected to each other; and
  a potential supply wire that applies predetermined potential to the multilayer cathode electrodes, in which
  the cathode electrodes of second and subsequent layers out of the multilayer cathode electrodes are electrically connected to the potential supply wire at a bottom of a first contact hole.

[A-2] The display device according to [A-1] described above, in which
  a cathode electrode of a first layer and the cathode electrodes of the second and subsequent layers are electrically connected to each other on a side wall of the first contact hole.

[A-3] The display device according to [A-2] described above, in which
  the cathode electrode of the first layer and the cathode electrodes of the second and subsequent layers are electrically connected to each other at a bottom of a second contact hole.

[A-4] The display device according to any one of [A-1] to [A-3] described above, in which a cathode contact portion in which the cathode electrodes of the second and subsequent layers are electrically connected to the potential supply wire is provided in an effective pixel area.

[A-5] The display device according to [A-4] described above, in which the cathode contact portion is provided for each pixel in the effective pixel area.

[A-6] The display device according to [A-4] described above, in which the cathode contact portion is provided for each area of a predetermined size in the effective pixel area.

[A-7] The display device according to [A-4] described above, in which the cathode contact portion is provided in the vicinity of a pixel in a central portion in the effective pixel area.

[A-8] The display device according to any one of [A-1] to [A-7] described above, in which the light emitting unit includes an organic electroluminescence element.

[A-9] The display device according to [A-8] described above, in which an organic layer of the organic electroluminescence element is formed in units of pixels using monochromatic light emitting organic materials of a plurality of colors.

[A-10] The display device according to [A-8] described above, in which an organic layer of the organic electroluminescence element is formed in common for all pixels using a white light emitting organic material, and
provided in one stage or stacked in two or more stages.

[A-11] The display device according to any one of [A-1] to [A-10] described above, in which a drive circuit unit of the light emitting unit is formed on a semiconductor substrate.

<<B. Method of Manufacturing Display Device>>

[B-1] A method of manufacturing a display device, the method including:

forming a protective film on a cathode electrode of a first layer to which predetermined potential is applied;
then forming a first contact hole leading to a contact electrode to which predetermined potential is applied in the protective film; and
then forming cathode electrodes of second and subsequent layers electrically connected to the contact electrode at a bottom of the first contact hole and electrically connected to the cathode electrode of the first layer on a side wall of the first contact hole. [B-2] The method of manufacturing the display device according to [B-1] described above, the method including:
forming a second contact hole leading to the cathode electrode of the first layer in the protective film formed on the cathode electrode of the first layer; and
then forming the cathode electrodes of the second and subsequent layers electrically connected to the cathode electrode of the first layer at a bottom of the second contact hole.

<<C. Electronic Device>>

[C-1] An electronic device including:

a display device including:
a light emitting unit;
multilayer cathode electrodes stacked on the light emitting unit in two or more layers with a protective film interposed between the cathode electrodes and electrically connected to each other; and
a potential supply wire that applies predetermined potential to the multilayer cathode electrodes, in which the cathode electrodes of second and subsequent layers out of the multilayer cathode electrodes are electrically connected to the potential supply wire at a bottom of a first contact hole.

[C-2] The electronic device according to [C-1] described above, in which a cathode electrode of a first layer and the cathode electrodes of the second and subsequent layers are electrically connected to each other on a side wall of the first contact hole.

[C-3] The electronic device according to [C-2] described above, in which the cathode electrode of the first layer and the cathode electrodes of the second and subsequent layers are electrically connected to each other at a bottom of a second contact hole.

[C-4] The electronic device according to any one of [C-1] to [C-3] described above, in which a cathode contact portion in which the cathode electrodes of the second and subsequent layers are electrically connected to the potential supply wire is provided in an effective pixel area.

[C-5] The electronic device according to [C-4] described above, in which the cathode contact portion is provided for each pixel in the effective pixel area.

[C-6] The electronic device according to [C-4] described above, in which the cathode contact portion is provided for each area of a predetermined size in the effective pixel area.

[C-7] The electronic device according to [C-4] described above, in which the cathode contact portion is provided in the vicinity of a pixel in a central portion in the effective pixel area.

[C-8] The electronic device according to any one of [C-1] to [C-7] described above, in which the light emitting unit includes an organic electroluminescence element.

[C-9] The electronic device according to [C-8] described above, in which an organic layer of the organic electroluminescence element is formed in units of pixels using monochromatic light emitting organic materials of a plurality of colors.

[C-10] The electronic device according to [C-8] described above, in which an organic layer of the organic electroluminescence element is formed in common for all pixels using a white light emitting organic material, and
provided in one stage or stacked in two or more stages.

[C-11] The electronic device according to any one of [C-1] to [C-10] described above, in which a drive circuit unit of the light emitting unit is formed on a semiconductor substrate.

REFERENCE SIGNS LIST

10 Organic EL display device
20 (20R, 20G, 20B) Pixel (sub-pixel)
20A Pixel circuit unit
21 (21R, 21G, 21B, 21W) Organic EL element (organic EL layer)
22 Drive transistor
23 Sampling transistor
24 Light emission control transistor
25 Holding capacitance
26 Auxiliary capacitance
30 Pixel array unit 40 Write scanning unit
50 Drive scanning unit
60 Signal output unit
70 Display panel
71 Semiconductor substrate
72 Interlayer film
73 Cathode electrode (upper electrode)
$73_1$ First cathode electrode
$73_2$ Second cathode electrode
$73_3$ Third cathode electrode
74 (74R, 74G, 74B) Anode electrode (lower electrode)
75 Contact electrode
76 Power supply wire
77 Wire of circuit unit
78, 82 Protective film
79 First contact hole
80 Second contact hole
83 Third contact hole
85 Cathode contact portion
90R, 90G, 90B Color filter

The invention claimed is:

1. A display device comprising:
a plurality of pixels arranged along a first direction, the plurality of pixels respectively including light emitting units;
multilayer cathode electrodes stacked on the light emitting units, the multilayer cathode electrodes including a first cathode electrode and a second cathode electrode with a protective film interposed therebetween, the first cathode electrode, the protective film and the second cathode electrode contiguously extending along the first direction for the plurality of pixels, the first cathode electrode being electrically connected to the second cathode electrode;
a potential supply wire that applies a predetermined potential to the multilayer cathode electrodes, wherein the second cathode electrode is electrically connected to the potential supply wire at a bottom of a first contact hole; and
a cathode contact that directly electrically connects the second cathode electrode to the potential supply wire, the cathode contact being located in an effective pixel area wherein the plurality of pixels are arranged.

2. The display device according to claim 1, wherein the first cathode electrode and the second cathode electrode are electrically connected to each other on a side wall of the first contact hole.

3. The display device according to claim 2, wherein the first cathode electrode and the second cathode electrode are electrically connected to each other at a bottom of a second contact hole.

4. The display device according to claim 1, wherein the cathode contact is one of a plurality of cathode contacts respectively provided for each of the plurality of pixels in the effective pixel area.

5. The display device according to claim 1, wherein the cathode contact is in one of a plurality of groups of cathode contacts respectively provided for each area of a predetermined size in the effective pixel area.

6. The display device according to claim 1, wherein the cathode contact is provided in a vicinity of one of the plurality of pixels in a central portion in the effective pixel area.

7. The display device according to claim 1, wherein the light emitting units respectively include an organic electroluminescence element.

8. The display device according to claim 7, wherein an organic layer of the organic electroluminescence element is formed in units of pixels using monochromatic light emitting organic materials of a plurality of colors.

9. The display device according to claim 7, wherein an organic layer of the organic electroluminescence element is formed in common for all of the plurality of pixels using a white light emitting organic material, and provided in one stage or stacked in two or more stages.

10. The display device according to claim 1, wherein drive circuits respectively corresponding to the light emitting units are formed on a semiconductor substrate.

11. An electronic device comprising the display device according to claim 1.

12. The electronic device according to claim 11, wherein the first cathode electrode and the second cathode electrode are electrically connected to each other on a side wall of the first contact hole.

13. The electronic device according to claim 12, wherein the first cathode electrode and the second cathode electrode are electrically connected to each other at a bottom of a second contact hole.

14. The electronic device according to claim 11, wherein the cathode contact is one of a plurality of cathode contacts respectively provided for each of the plurality of pixels in the effective pixel area.

15. The electronic device according to claim 11, wherein the cathode contact is in one of a plurality of groups of cathode contacts respectively provided for each area of a predetermined size in the effective pixel area.

16. The electronic device according to claim 11, wherein the cathode contact is provided in a vicinity of one of the plurality of pixels in a central portion in the effective pixel area.

17. The electronic device according to claim 11, wherein the light emitting units respectively include an organic electroluminescence element.

18. The electronic device according to claim 17, wherein an organic layer of the organic electroluminescence element is formed in units of pixels using monochromatic light emitting organic materials of a plurality of colors.

* * * * *